United States Patent
Park et al.

(10) Patent No.: US 11,830,737 B2
(45) Date of Patent: Nov. 28, 2023

(54) SEMICONDUCTOR DEVICE AND METHOD OF FABRICATING THE SAME

(71) Applicant: Samsung Electronics Co., Ltd., Suwon-si (KR)

(72) Inventors: Hanhum Park, Suwon-si (KR); Insung Kim, Seongnam-si (KR); Woojeong Shin, Suwon-si (KR); Jung-Hoon Lee, Seoul (KR); Sanghyeon Kim, Suwon-si (KR); Ji Young Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 199 days.

(21) Appl. No.: 17/520,634

(22) Filed: Nov. 6, 2021

(65) Prior Publication Data

US 2022/0293421 A1   Sep. 15, 2022

(30) Foreign Application Priority Data

Mar. 10, 2021 (KR) .................. 10-2021-0031440

(51) Int. Cl.
*H01L 21/033* (2006.01)

(52) U.S. Cl.
CPC ...... *H01L 21/0338* (2013.01); *H01L 21/0335* (2013.01); *H01L 21/0337* (2013.01)

(58) Field of Classification Search
CPC ............. H01L 21/0332; H01L 21/0334; H01L 21/0335; H01L 21/0337; H01L 21/0338
See application file for complete search history.

(56) References Cited

U.S. PATENT DOCUMENTS

| | | |
|---|---|---|
| 6,358,856 B1 | 3/2002 | Yons et al. |
| 9,478,462 B1 | 10/2016 | Wang et al. |
| 9,761,452 B1 | 9/2017 | Shu et al. |
| 9,859,120 B1 | 1/2018 | Sun et al. |
| 9,991,156 B2 | 6/2018 | Burns et al. |
| 10,366,917 B2 | 7/2019 | Zhu et al. |
| 10,395,926 B1 | 8/2019 | Tang et al. |
| 10,546,774 B2 | 1/2020 | Burns et al. |
| 10,734,229 B2 | 8/2020 | deVilliers et al. |

(Continued)

OTHER PUBLICATIONS

Raley, Angelique et. al., Self-aligned blocking integration demonstration for critical sub-40nm pitch Mx level patterning, Advanced Etch Technology for Nanopatterning VI, Proc. of SPIE vol. 10149, 101490O (2017).

*Primary Examiner* — Walter H Swanson
(74) *Attorney, Agent, or Firm* — Muir Patent Law, PLLC

(57) ABSTRACT

Disclosed are semiconductor device fabricating method and semiconductor device fabricated by the same. The method includes forming on a lower mask layer first upper mask patterns and sacrificial spacers that cover sidewalls of the first upper mask patterns, forming first holes in the lower mask layer below the first upper mask patterns, forming second holes in the lower mask layer not covered by the first upper mask patterns and the sacrificial spacers, forming second upper mask patterns filling a space between the sacrificial spacers on the lower mask layer and also forming sacrificial patterns filling the first and second holes, removing the sacrificial spacers, using the first and second upper mask patterns to etch the lower mask layer, and removing the sacrificial patterns.

11 Claims, 45 Drawing Sheets

(56) References Cited

U.S. PATENT DOCUMENTS 10,755,969 B2 8/2020 Chu et al.
2014/0363963 A1* 12/2014 Kiyotoshi .......... H01L 21/3086
438/593

* cited by examiner

SEMICONDUCTOR DEVICE AND METHOD OF FABRICATING THE SAME

CROSS-REFERENCE TO RELATED APPLICATION

This U.S. nonprovisional application claims priority under 35 U.S.C § 119 to Korean Patent Application No. 10-2021-0031440 filed on Mar. 10, 2021 in the Korean Intellectual Property Office, the disclosure of which is hereby incorporated by reference in its entirety.

BACKGROUND

The present inventive concepts provide a semiconductor device and a method of fabricating the same.

The high integration of semiconductor devices induces a reduction in line-width and pitch of patterns. As an approach for fine line-width and pitch, there have been developed various patterning techniques such as double patterning or litho-etching-litho-etching (LELE). However, the reduction in line-width of patterns may increase the occurrence of process failure such as undesirable deformation of patterns or collapse of patterns. Accordingly, there is need to develop a technique not only to prevent process failure, but to achieve fine patterning.

SUMMARY

Some embodiments of the present inventive concepts provide a method of fabricating a semiconductor device, which method is capable of avoiding process failure and forming fine patterns.

Some embodiments of the present inventive concepts provide a highly integrated semiconductor device with increased reliability.

According to some embodiments of the present inventive concepts, a method of fabricating a semiconductor device may include: stacking a lower mask layer on an entire surface of a substrate; forming on the lower mask layer a plurality of first upper mask patterns and a plurality of sacrificial spacers that cover sidewalls of the first upper mask patterns, wherein the first upper mask patterns and the sacrificial spacers have a line shape that extends in a first direction; forming a plurality of first holes that expose a top surface of an etching target layer by removing a portion of the first upper mask patterns and a portion of the lower mask layer below the first upper mask patterns; forming a plurality of second holes that expose the top surface of the etching target layer by removing a portion of the lower mask layer that is not covered by the first upper mask patterns and the sacrificial spacers; forming a plurality of second upper mask patterns and a plurality of sacrificial patterns, the second upper mask patterns filling a space between the sacrificial spacers on the lower mask layer, and the sacrificial patterns filling the first holes and the second holes; removing the sacrificial spacers to expose a top surface of the lower mask layer; using the first and second upper mask patterns as an etching mask to etch the lower mask layer to form first and second lower mask patterns; and removing the sacrificial patterns.

According to some embodiments of the present inventive concepts, a semiconductor device may include: a substrate that includes a main region and an edge region; first to third line patterns that have line patterns extending in a first direction, respectively and are sequentially arranged in a second direction intersecting the first direction on the main region of the substrate, wherein the first to third line patterns are spaced apart from each other by a first distance in the second direction; and a residual pattern on the edge region of the substrate and spaced apart from the first to third line patterns in the first direction, the residual pattern having an arc or U shape when viewed in plan. The residual pattern may have a first end adjacent to the first line pattern and a second end adjacent to the third line pattern. A distance between the first end and the second end may correspond to a sum of twice the first distance and a second width of the second line pattern in the second direction.

According to some embodiments of the present inventive concepts, a semiconductor device may include: a substrate that includes a main region and an edge region; first to seventh line patterns that have line shapes extending in a first direction, respectively and are sequentially arranged in a second direction intersecting the first direction on the main region of the substrate, wherein the first to seventh line patterns are spaced apart from each other by a first distance in the second direction; and a first residual pattern and a second residual pattern on the edge region of the substrate, the first residual pattern being adjacent to the first to third line patterns, and the second residual pattern being adjacent to the fifth to seventh line patterns. Each of the first and second residual patterns may have an arc or 'U' shape when viewed in plan. The first residual pattern may have a first width in the second direction. The second residual pattern may have a second width in the second direction. The second width may be different from the first width.

BRIEF DESCRIPTION OF THE DRAWINGS

FIGS. 2A to 17A illustrate plan views showing a method of fabricating a semiconductor device according to some embodiments of the present inventive concepts.

FIGS. 2B to 16B illustrate cross-sectional views taken along line A-A' of FIGS. 2A to 16A, respectively.

FIGS. 18A to 20A illustrate plan views showing a method of fabricating a semiconductor device according to some embodiments of the present inventive concepts.

FIGS. 18B to 20B illustrate cross-sectional views taken along line A-A' of FIGS. 18A to 20A, respectively.

DETAILED DESCRIPTION

Figure 1:
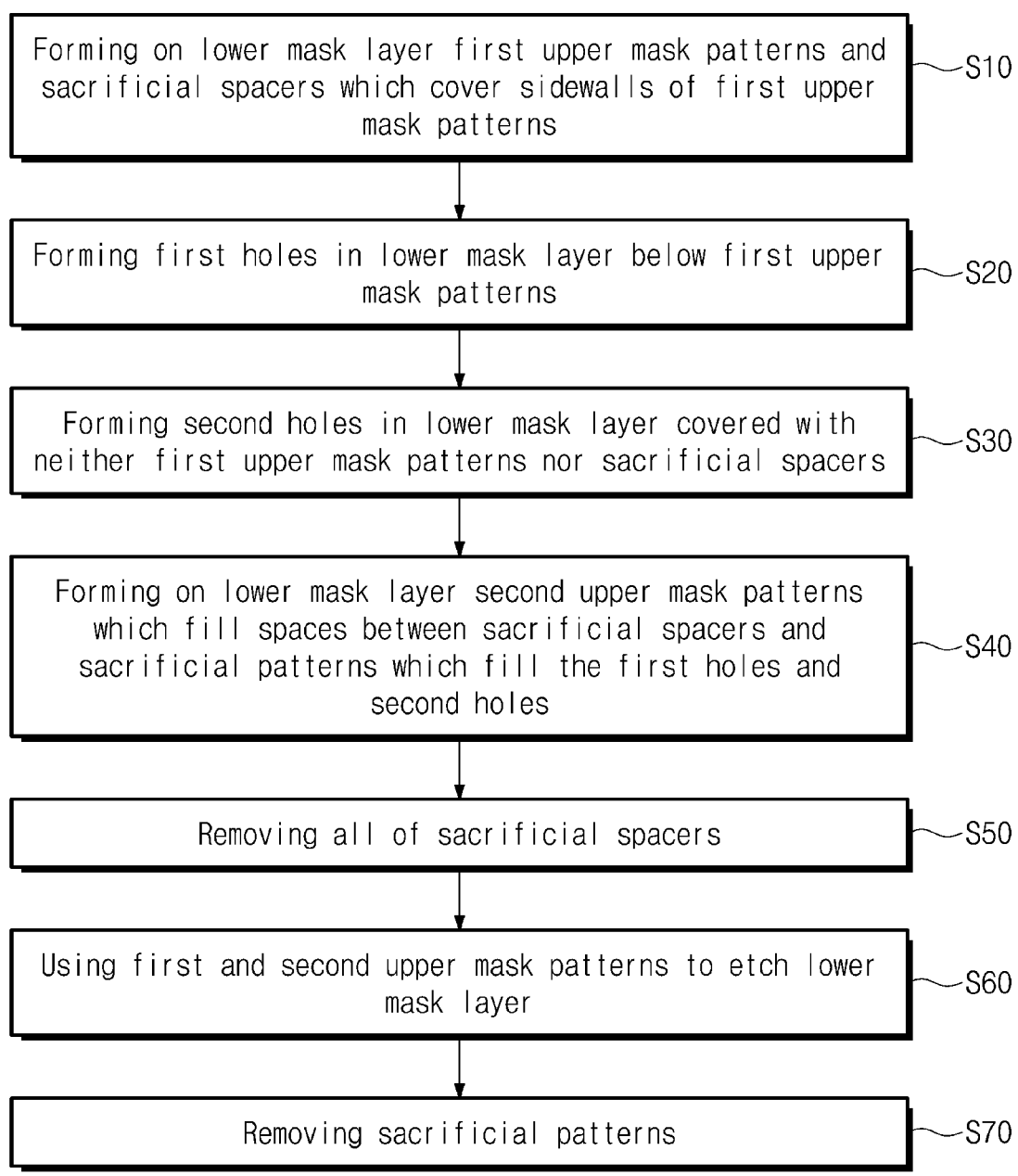
FIG. 1 illustrates a flow chart showing a method of fabricating a semiconductor device according to the present inventive concepts.

The advantages and features of the present inventive concepts, and methods of achieving them will be apparent from the following exemplary embodiments that will be described below in detail with reference to the accompanying drawings showing the exemplary embodiments. It should be noted, however, that the present inventive concepts are not limited to the following exemplary embodiments, and may be implemented in various forms. Rather, the exemplary embodiments are provided only to disclose the present inventive concepts and let those skilled in the art fully know the scope of the present inventive concepts. The present inventive concepts are defined only by the scope of the claims and equivalents thereof. Like reference numerals refer to like elements throughout the specification. The ordinal terms such as "first", "second", "third", and so forth will used to distinguish from each other various components having the same/similar functions in this description, but in many cases the present inventive concepts are not limited by the terms, and the terms such as "first", "second", and "third" will be interchangeable depending on the sequence of mention. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

The following will now describe some embodiments of the present inventive concepts in conjunction with the accompanying drawings.

FIG. 1 illustrates a flow chart showing a method of fabricating a semiconductor device according to the present inventive concepts. FIGS. 2A to 17A illustrate plan views showing a method of fabricating a semiconductor device according to some embodiments of the present inventive concepts. FIGS. 2B to 16B illustrate cross-sectional views taken along line A-A' of FIGS. 2A to 16A, respectively. FIG. 17B illustrates a cross-sectional view taken along lines A-A' and C-C' of FIG. 17A.

Referring to FIG. 1, first upper mask patterns may be formed on a lower mask layer, and on the lower mask layer, sacrificial spacers may be formed to cover sidewalls of the first upper mask patterns (S10).

Figure 2A:
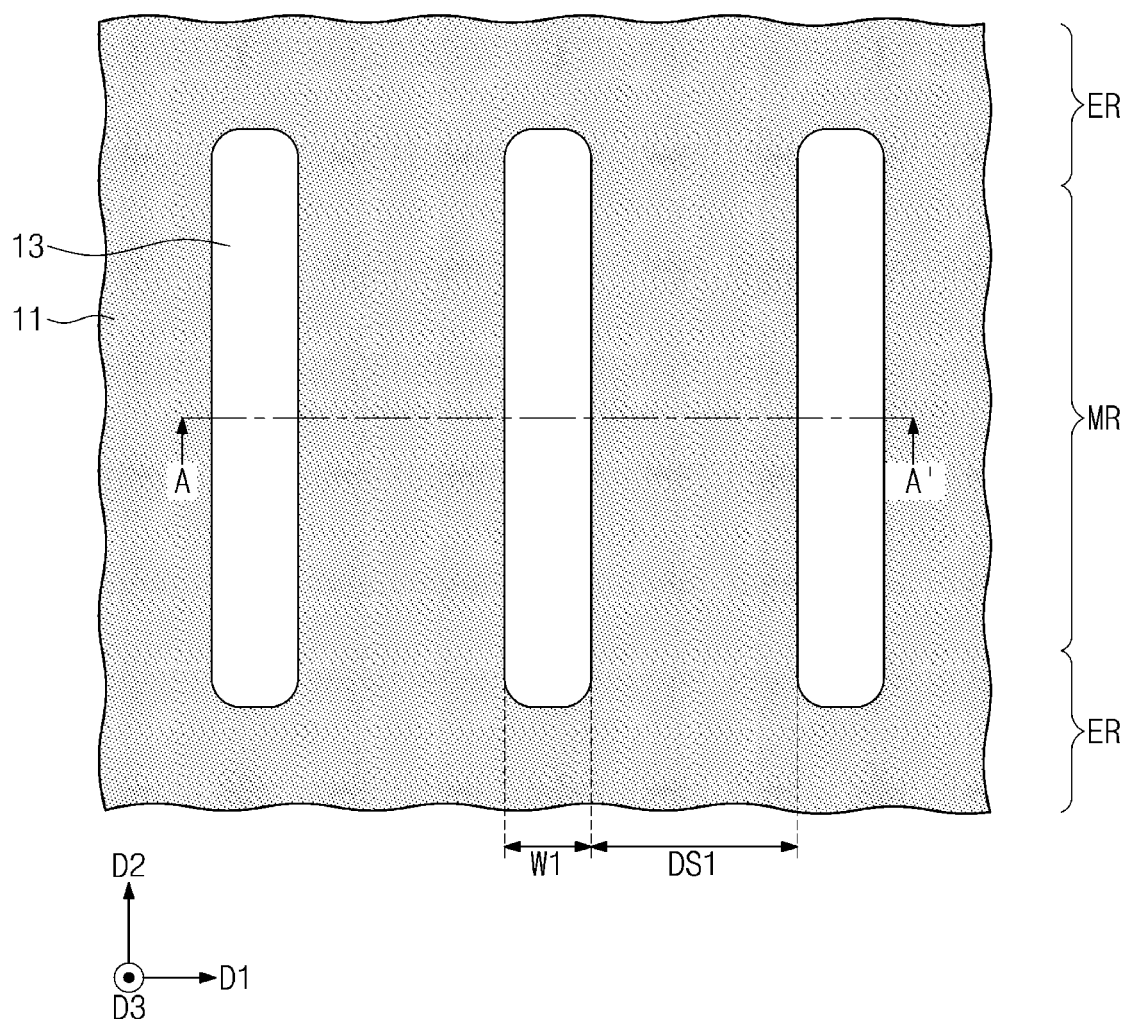
Figure 2B:
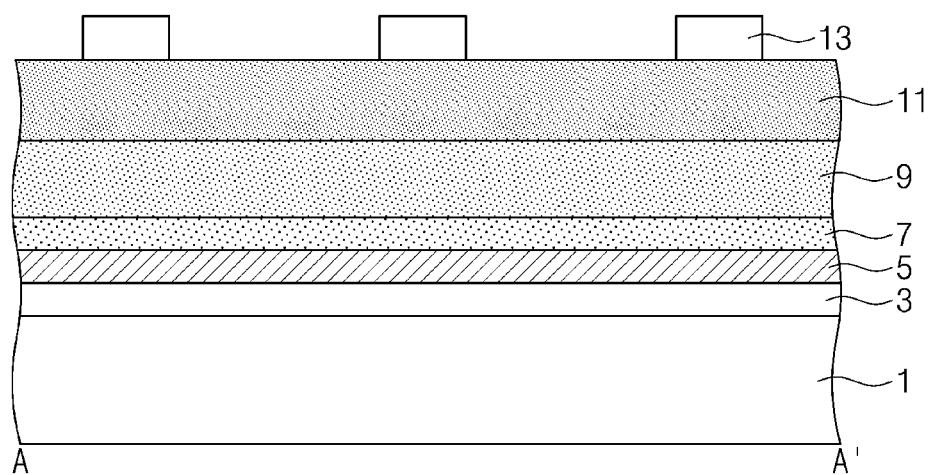
Figure 2B:
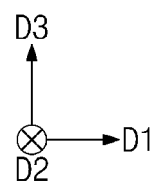
Figure 3A:
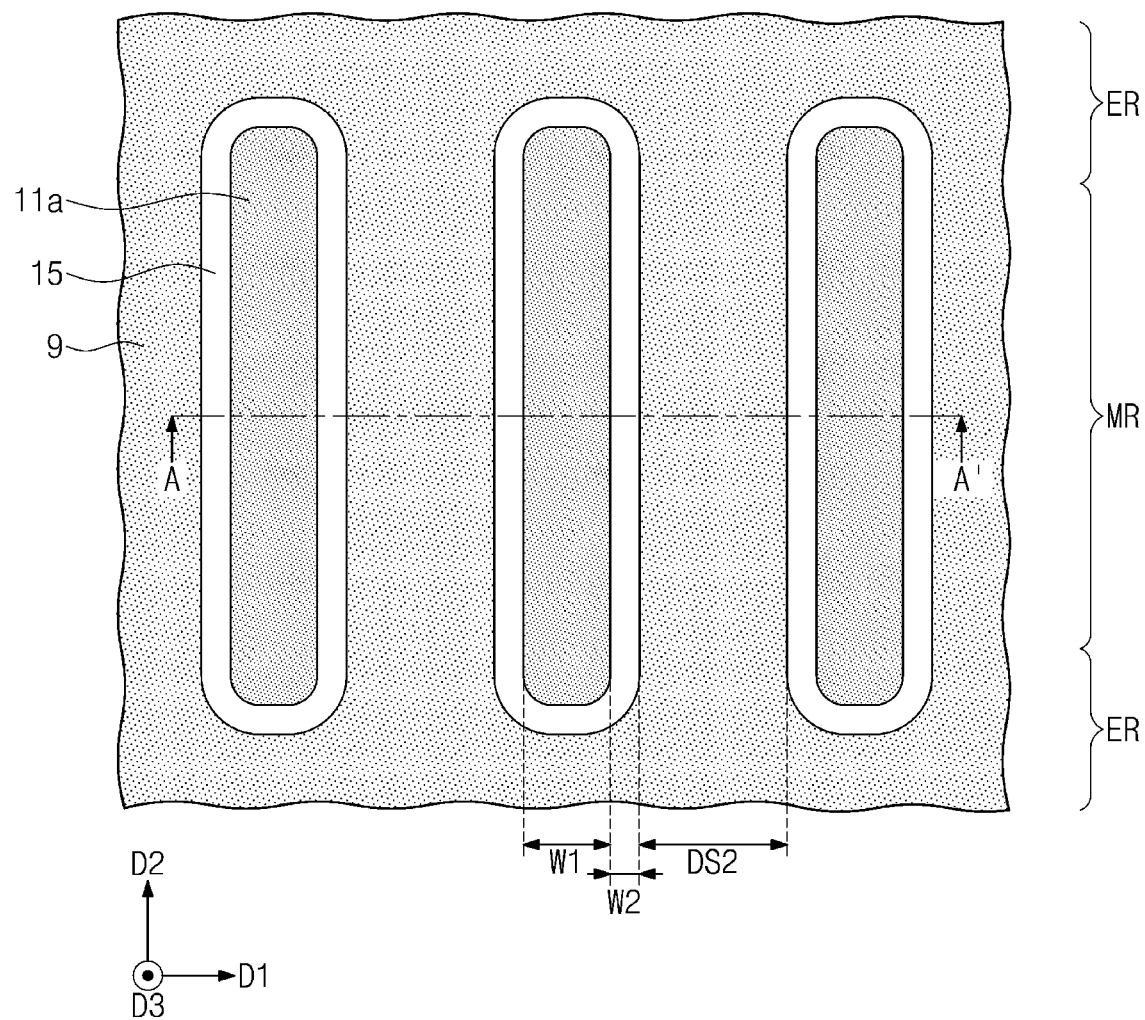
Figure 3B:
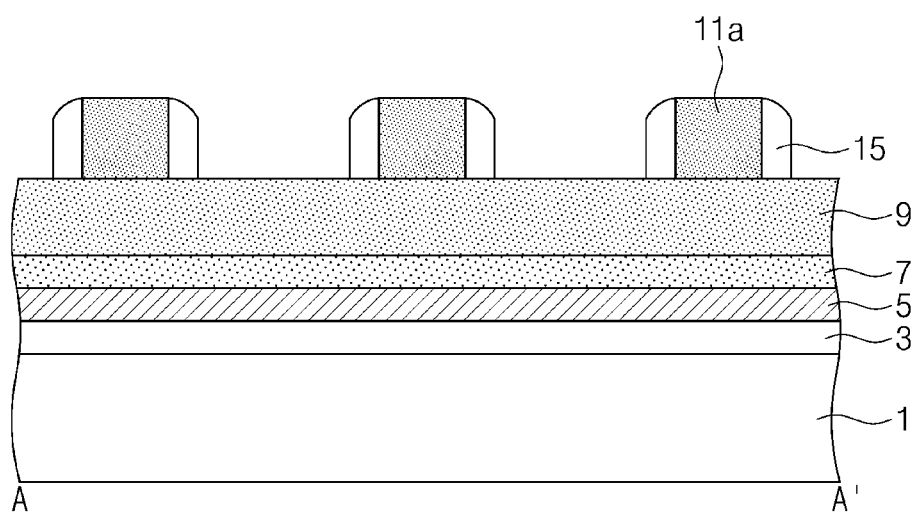
Figure 3B:
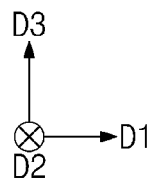
Figure 4A:
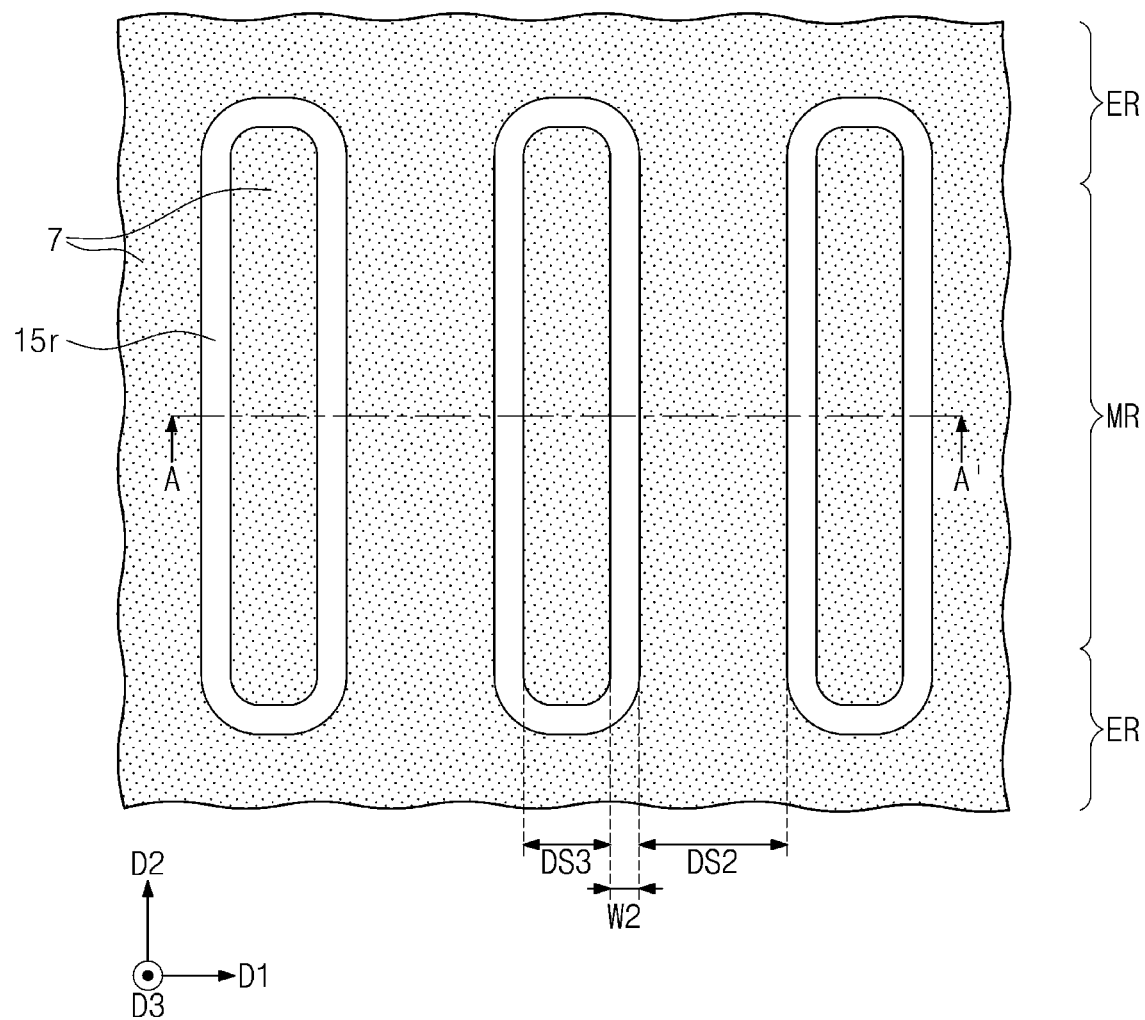
Figure 4B:
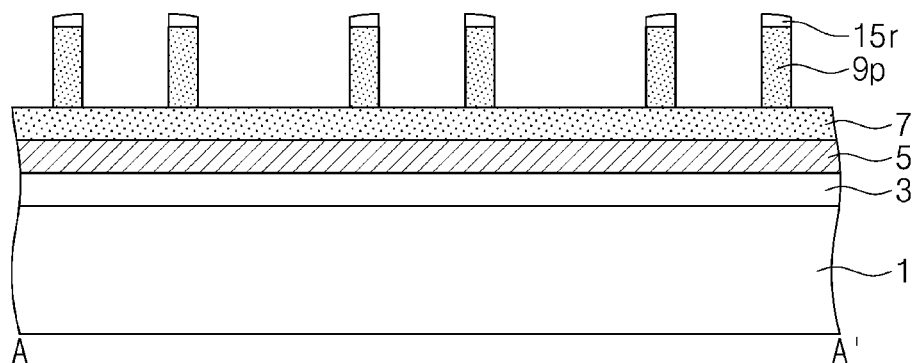
Figure 4B:
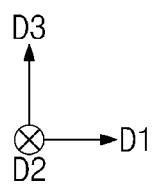
Figure 5A:
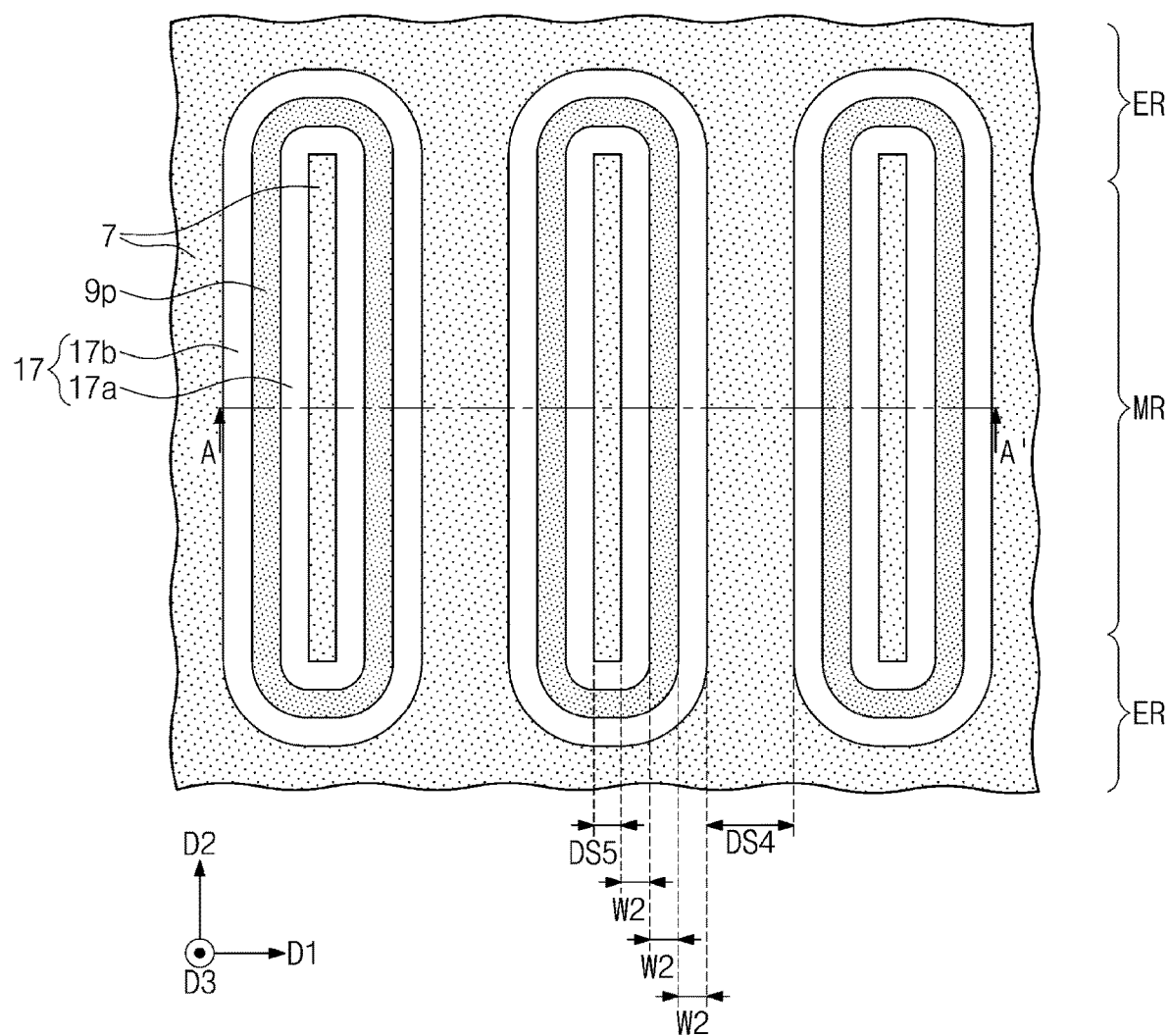
Figure 5B:
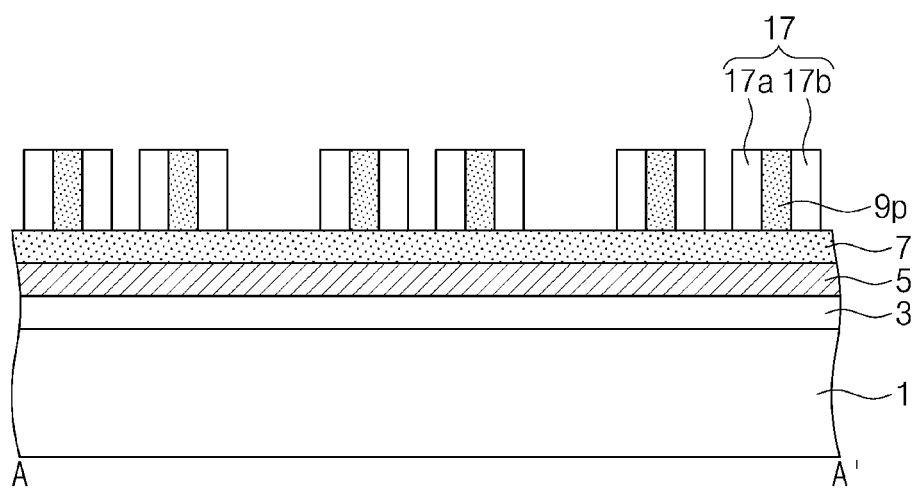
Figure 5B:
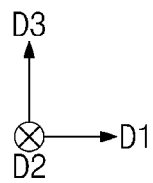

To do so, referring to FIGS. 2A and 2B, an interlayer dielectric layer 3, an etching target layer 5, a lower mask layer 7, an upper mask layer 9, and a sacrificial mask layer 11 may be sequentially stacked on a substrate 1. The substrate 1 may be a semiconductor substrate including a semiconductor material such as silicon. The substrate 1 may be, for example, a single-crystalline silicon substrate or a silicon-on-insulator (SOI) substrate. Although not shown, the substrate 1 may be provided thereon with a device isolation layer and one or more transistors. The substrate 1 may include a main region MR and an edge region ER disposed on opposite edges of the main region MR. The main region MR may be an area, which is called a cell region or a logic circuit region, where a plurality of wiring patterns are disposed. The edge region ER may correspond to a boundary area between main regions MR. The edge region ER may not include any circuit pattern required for actual operations of a semiconductor device, but may include dummy patterns or test patterns.

The interlayer dielectric layer 3 may have a single-layered or multi-layered structure of at least one selected from a silicon oxide layer, a silicon oxynitride layer, a silicon nitride layer, and a porous dielectric layer. The etching target layer 5 may be a dielectric or conductive layer. The conductive layer may contain metal or impurity-doped polysilicon. The lower mask layer 7, the upper mask layer 9, and the sacrificial mask layer 11 may include their materials that are different from each other or that have different etch selectivity from each other. For example, the lower mask layer 7 may include silicon oxynitride (SiON) or silicon nitride (SiN). The upper mask layer 9 may include, for example, polysilicon or silicon-germanium. The sacrificial mask layer 11 may be, for example, a spin-on-hardmask (SOH) layer or a carbon-based layer formed by spin coating and curing processes. The lower mask layer 7 may correspond to the lower mask layer of FIG. 1.

A photolithography process may be performed to form first photoresist patterns 13 on the sacrificial mask layer 11. The first photoresist patterns 13 may be sequentially arranged along a first direction D1 and may have their line shapes extending in a second direction D2 that intersects the first direction D1. The first photoresist patterns 13 may run across the main region MR and may extend to the edge region ER. The first photoresist patterns 13 may be rounded at corners thereof. The first photoresist patterns 13 may each have a first width W1. The first photoresist patterns 13 may be spaced apart from each other at a first distance DS1 in the first direction D1. The first width W1 may be equal to or greater than about 3 times a desired width of a finally formed pattern. The first distance DS1 may be equal to or greater than about 5 times a desired width of a finally formed pattern. In the present embodiment, the first width W1 may be about 3 times a desired width of a finally formed pattern, and the first distance DS1 may be about 7 times the desired width. Terms such as "about" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0% to 5% deviation around 0.1 and a 0% to 5% deviation around 1, especially if such deviation maintains the same effect as the listed range.

Referring to FIGS. 2A, 2B, 3A, and 3B, the first photoresist patterns 13 may be used as an etching mask to etch the sacrificial mask layer 11 to form sacrificial mask patterns 11a. While the sacrificial mask patterns 11a are formed, the first photoresist patterns 13 may all be etched and removed or may partially remain. Shapes of the first photoresist patterns 13 may be transferred such that the sacrificial mask patterns 11a may each have the same first width W1 as that of each first photoresist pattern 13. A first sacrificial spacer layer may be stacked to have a constant thickness (e.g., W2 of FIG. 3A) regardless of position on an entire surface of the substrate 1, and then the first sacrificial spacer layer may be anisotropically etched to form first sacrificial spacers 15 that cover sidewalls of the sacrificial mask patterns 11a.

The first sacrificial spacers 15 may be formed of a material having an etch selectivity with respect to the sacrificial mask patterns 11a and also to the upper mask layer 9. For example, the first sacrificial spacers 15 may include silicon oxide formed by atomic layer deposition (ALD). The first sacrificial spacers 15 may each have a second width W2. The second width W2 may correspond to a desired width of a finally formed pattern. When viewed in plan, the first sacrificial spacers 15 may have a closed loop shape that elongates in the second direction D2 and has an empty space therein. The first sacrificial spacers 15 may each have on the main region MR a line shape that elongates in the second direction D2, and may also have on the edge region ER an arc or U shape to which adjacent two line shapes are connected. Neighboring first sacrificial spacers 15 may be spaced apart from each other at a second distance DS2 in the first direction D1. The second distance DS2 may correspond to a value obtained by subtracting twice the second width W2 from the first distance DS1.

Referring to FIGS. 3A, 3B, 4A, and 4B, the first sacrificial spacers 15 may be used as an etching mask such that the upper mask layer 9 may be etched to form first upper mask patterns 9p and to expose a surface of the lower mask layer 7. In this case, portions 15r of the first sacrificial spacers 15 may remain on the first upper mask patterns 9p. The first upper mask patterns 9p may correspond to the first upper mask patterns of FIG. 1. The first upper mask patterns 9p may be formed to have the same planar shape as that of the first sacrificial spacers 15. For example, when viewed in plan, the first upper mask patterns 9p may each have a closed loop shape with an empty space therein. Portions 15r of the first sacrificial spacers 15 or the first upper mask patterns 9p may be spaced by a third distance DS3 in the first direction D1 with the empty space therebetween. The third distance DS3 may be equal to the first width W1.

Referring to FIGS. 4A, 4B, 5A, and 5B, a second sacrificial spacer layer may be stacked to have a constant thickness (e.g., W2 of FIG. 5A) regardless of position on the entire surface of the substrate 1, and then the second sacrificial spacer layer may be anisotropically etched to form second sacrificial spacers 17 that cover sidewalls of the first upper mask patterns 9p. The second sacrificial spacers 17 may correspond to the sacrificial spacers of FIG. 1.

The second sacrificial spacers 17 may be formed of a material having an etch selectivity with respect to the first upper mask patterns 9p and also to the lower mask layer 7. For example, the first upper mask patterns 9p may include or be formed of silicon oxide formed by atomic layer deposition (ALD). While the second sacrificial spacers 17 are formed, the portions 15r of the first sacrificial spacers 15 may all be removed, and top surfaces of the first upper mask patterns 9p may be exposed. The second sacrificial spacers 17 may each have the second width W2.

The second sacrificial spacers 17 may include second inner sacrificial spacers 17a that cover inner sidewalls of the first upper mask patterns 9p, and may also include second outer sacrificial spacers 17b that covers outer sidewalls of the first upper mask patterns 9p. When viewed in plan, the second inner sacrificial spacers 17a and the second outer sacrificial spacers 17b may all have a closed loop shape with an empty space therein. Neighboring second outer sacrificial spacers 17b may have therebetween a fourth distance DS4 equal to or greater than the second width W2. For example, In the present embodiment, the fourth distance DS4 may correspond to about three times the second width W2. On the main region MR, the second inner sacrificial spacers 17a may have line patterns, an interval between the line patterns may be a fifth distance DS5 that corresponds to a width in the first direction D1 of an inner space within the second inner sacrificial spacers 17a. The fifth distance DS5 may be the same as the second width W2. The second width W2 and the fifth distance DS5 may each range, for example, from about 5 nm to about 9 nm.

Referring to FIG. 1, first holes may be formed in the lower mask layer below the first upper mask patterns (S20).

Figure 6A:
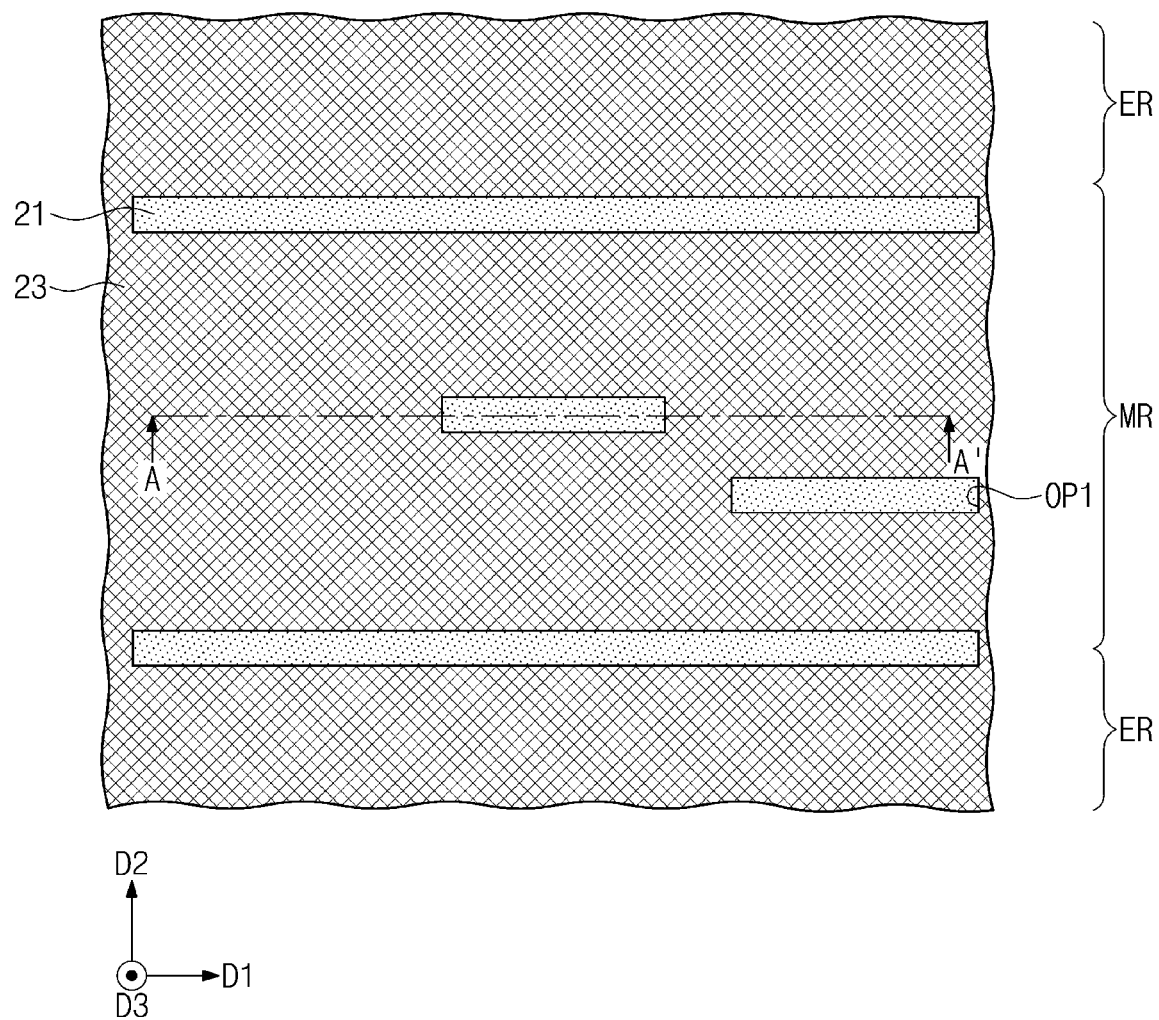
Figure 6B:
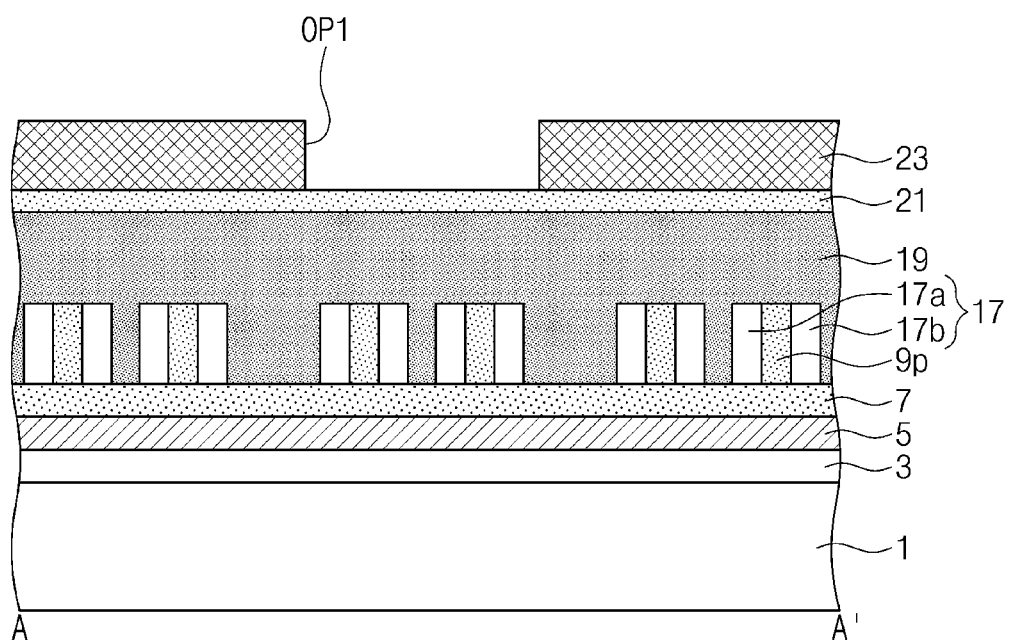
Figure 6B:
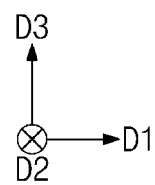

To do so, referring to FIGS. 6A and 6B, a first sacrificial fill layer 19 may be formed on the entire surface of the substrate 1. The first sacrificial fill layer 19 may include a material that is different from those of the second sacrificial spacers 17 and the first upper mask patterns 9p or that has an etch selectivity with respect to the second sacrificial spacers 17 and the first upper mask patterns 9p. The first sacrificial fill layer 19 may be formed of a spin-on-hardmask (SOH) layer or a carbon-based layer formed by spin coating and curing processes. As shown in FIG. 6B, the first sacrificial fill layer 19 may fill a space between the second sacrificial spacers 17. As the first sacrificial fill layer 19 is formed of a spin-on-hardmask (SOH) layer, the first sacrificial fill layer 19 may have excellent gap-fill capability to satisfactorily fill a space between the second sacrificial spacers 17 and to have a flat top surface. Accordingly, process failure may be prevented.

A first antireflection layer 21 and a second photoresist pattern 23 may be formed on the first sacrificial fill layer 19. The first antireflection layer 21 may be formed of, for example, SiON. The second photoresist pattern 23 may include first openings OP1 that expose the first antireflection layer 21. When viewed in plan, one or more of the first openings OP1 may have a bar or line shape that elongates in the first direction D1 on the main region MR. In addition, another or more of the first openings OP1 may be disposed on a boundary between the main region MR and the edge region ER, while having a line shape that extends in the first direction D1.

Figure 7A:
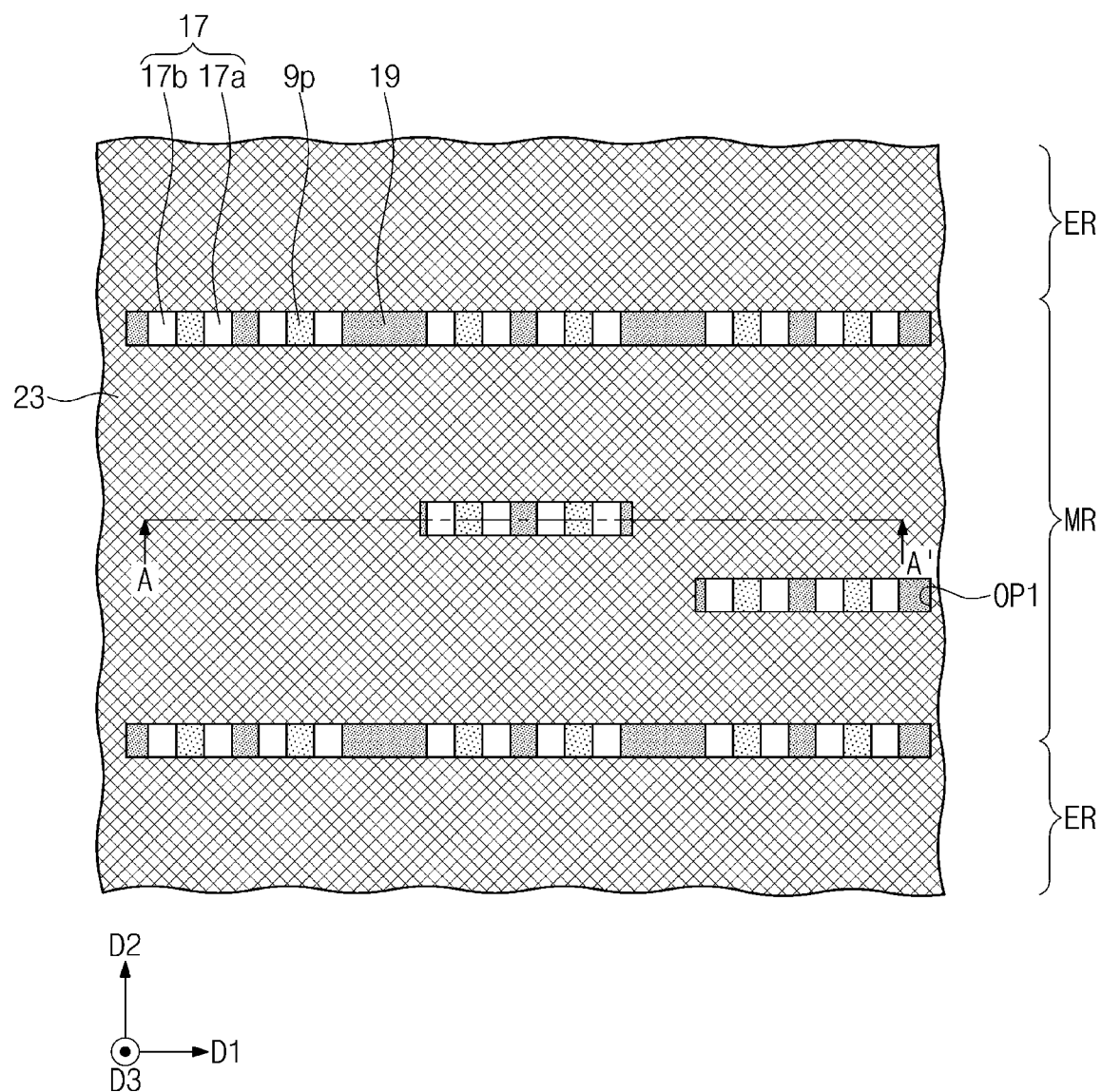
Figure 7B:
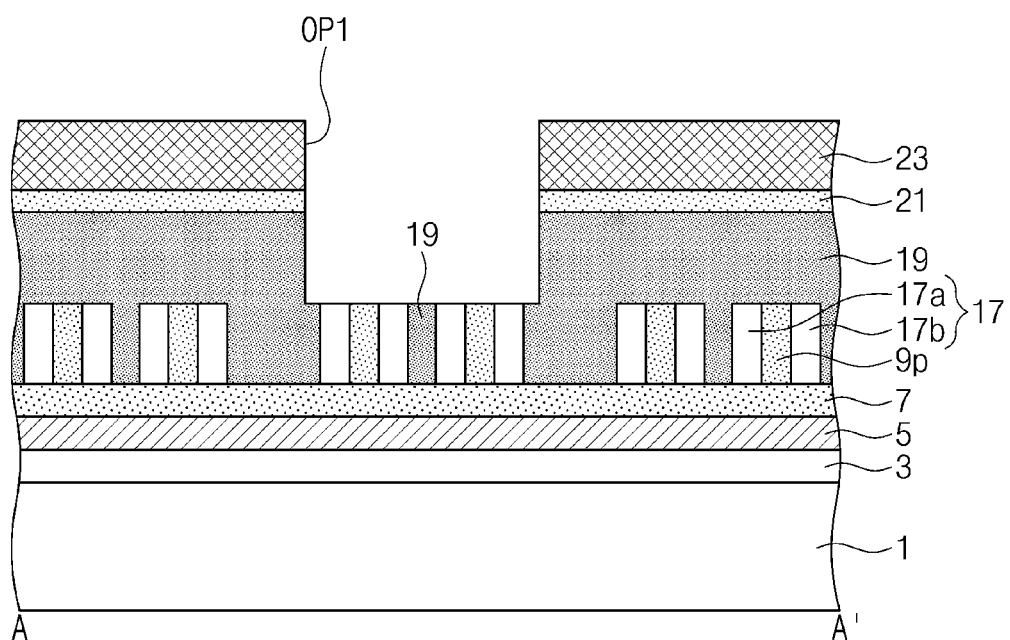
Figure 7B:
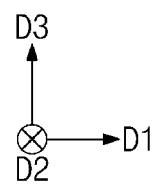
Figure 8A:
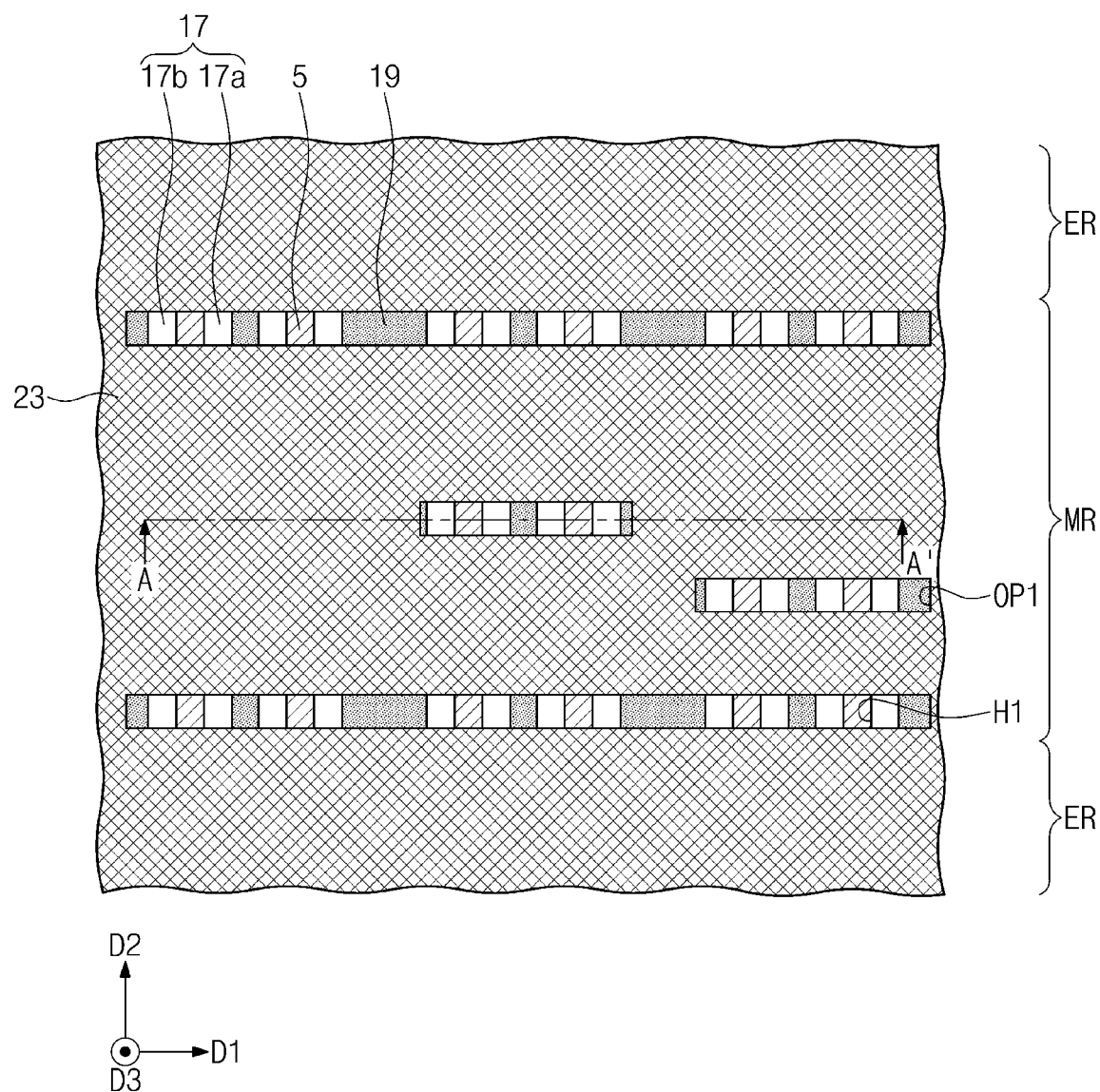
Figure 8B:
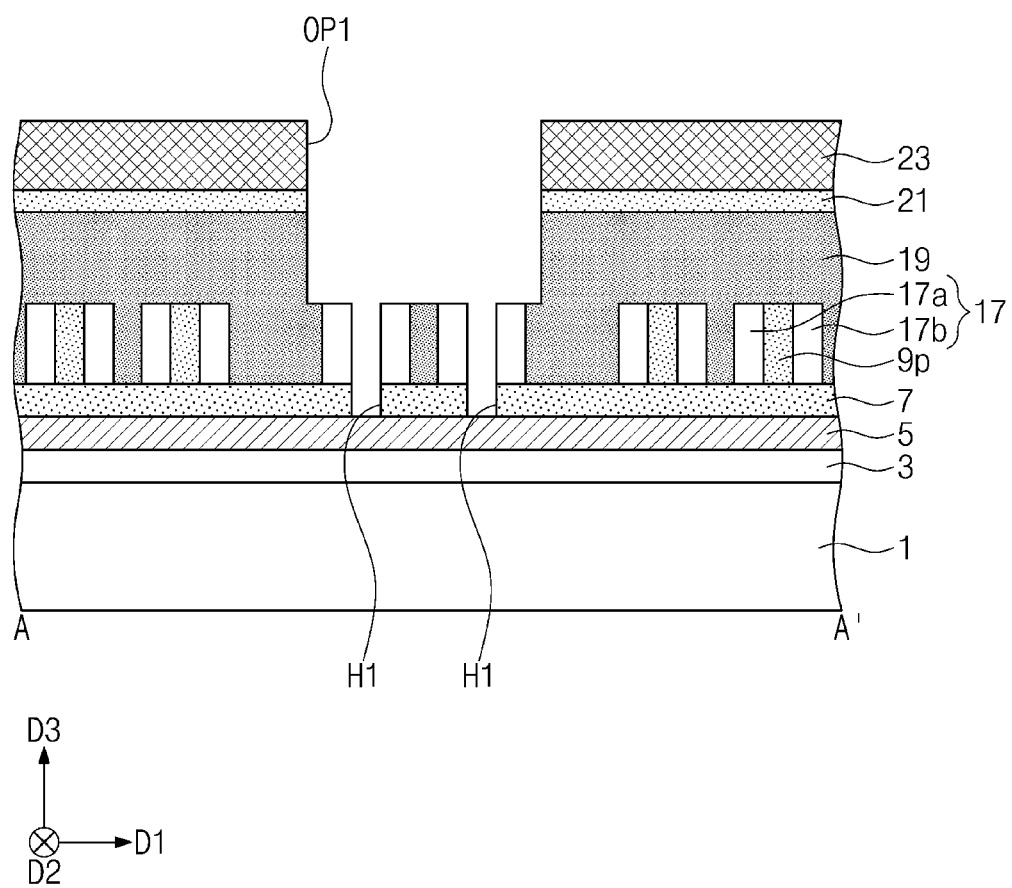

Referring to FIGS. 7A and 7B, the second photoresist pattern 23 may be used as an etching mask such that the first antireflection layer 21 and its underlying first sacrificial fill layer 19 may be sequentially anisotropically etched to expose top surfaces of the second sacrificial spacers 17 and top surfaces of the first upper mask patterns 9p. In addition, the first sacrificial fill layer 19 may be partially exposed between the second sacrificial spacers 17.

Referring to FIGS. 7A, 7B, 8A, and 8B, among the second sacrificial spacers 17, the first upper mask patterns 9p, and the first sacrificial fill layer 19 that are exposed to the first opening OP1, the first upper mask patterns 9p may be selectively etched to form first holes H1 that expose a top surface of the lower mask layer 7. In addition, portions of the lower mask layer 7 exposed to the first holes H1 may be anisotropically etched to expose the etching target layer 5. Therefore, the first holes H1 may be transferred to the lower mask layer 7. The first holes H1 may correspond to "the first holes" of FIG. 1.

The etching processes to etch the first upper mask patterns 9p and the lower mask layer 7 may be in-situ performed sequentially in a single etching chamber, which may result in a simplification of process.

In the present inventive concepts, the second sacrificial spacers 17, the first upper mask patterns 9p, and the first sacrificial fill layer 19 that are exposed to the first opening OP1 may include their materials that are different from each other or that have different etch selectivity from each other, and the etch selectivity may be used to selectively remove patterns formed of specific materials, with the result that the first opening OP1 may be formed to have a relatively large width. Accordingly, it may be possible to increase a process margin and to prevent process failure such as bridge or short-circuit.

Figure 9A:
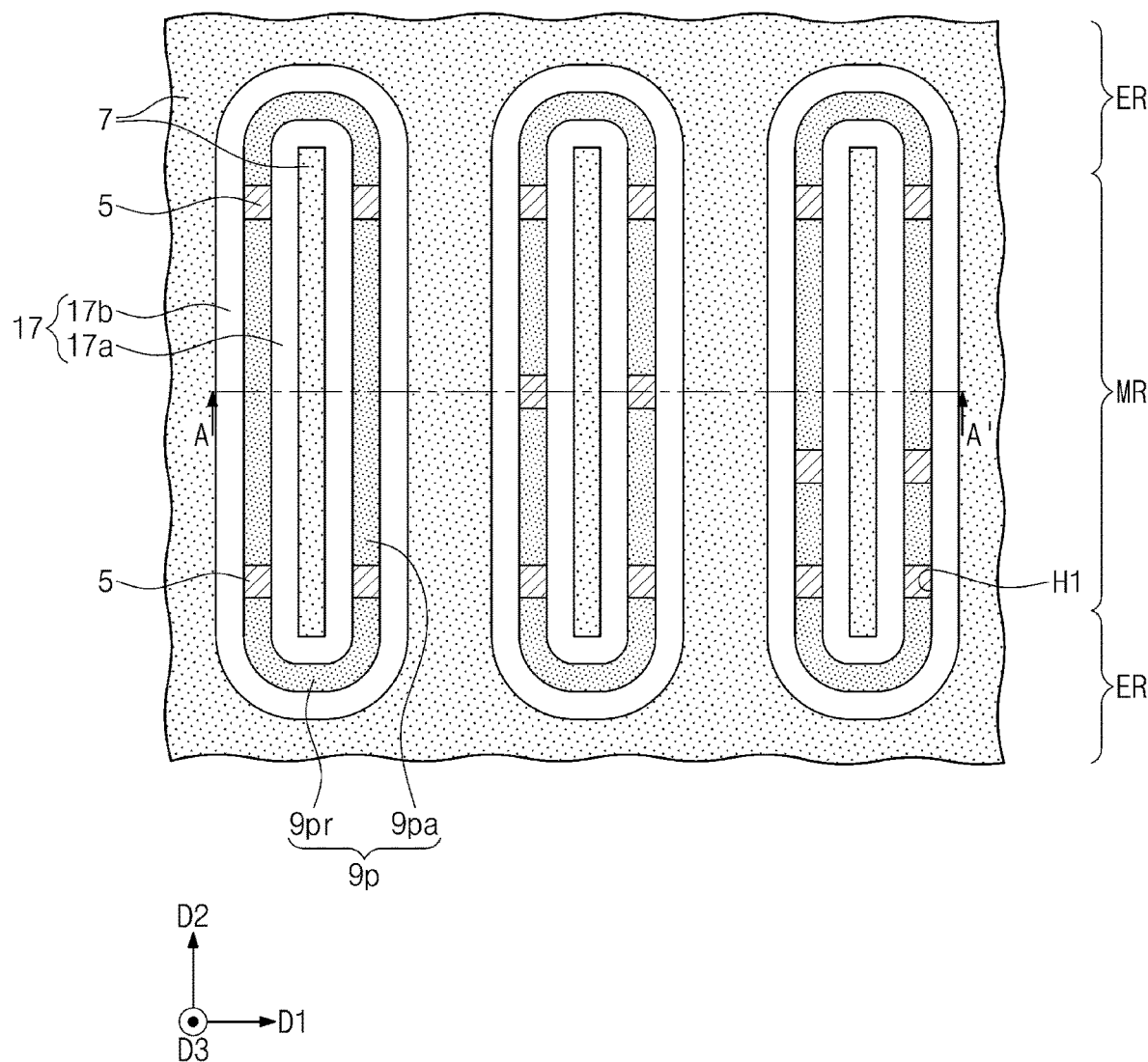
Figure 9B:
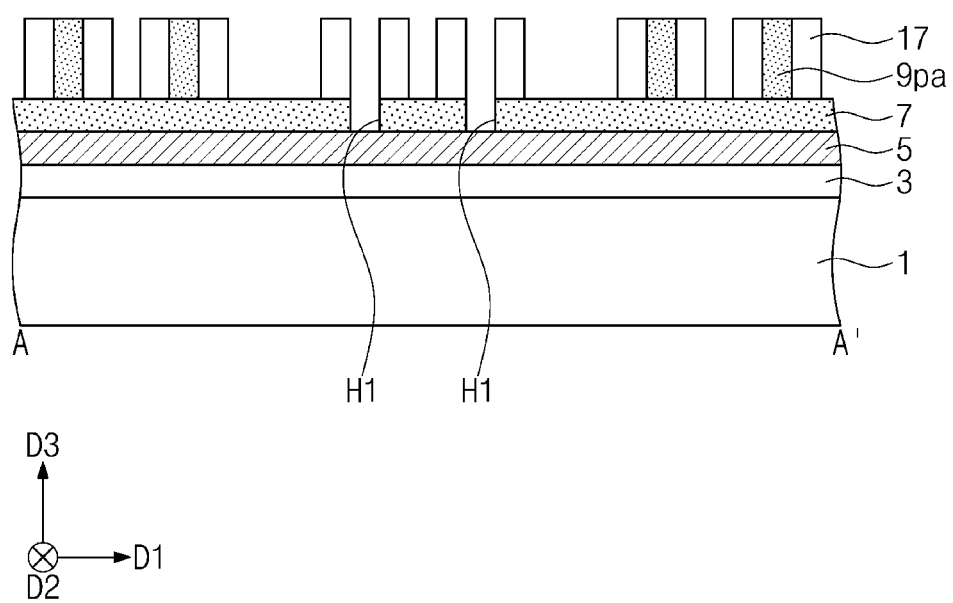

Referring to FIGS. 8A, 8B, 9A, and 9B, the second photoresist pattern 23, the first antireflection layer 21, and the first sacrificial fill layer 19 may be sequentially removed to expose the second sacrificial spacers 17, the first upper mask patterns 9p, and the lower mask layer 7. As shown in FIG. 9A, the formation of the first holes H1 may cut the first upper mask patterns 9p into a plurality of parts 9pa and 9pr. Therefore, the first upper mask patterns 9p may include upper line mask patterns 9pa that extend in the second direction D2 on the main region MR, and may include arc or U-shaped upper residual mask patterns 9pr on the edge region ER.

Referring to FIG. 1, second holes may be formed in the lower mask layer covered with neither the first upper mask patterns nor the sacrificial spacers (S30).

Figure 10A:
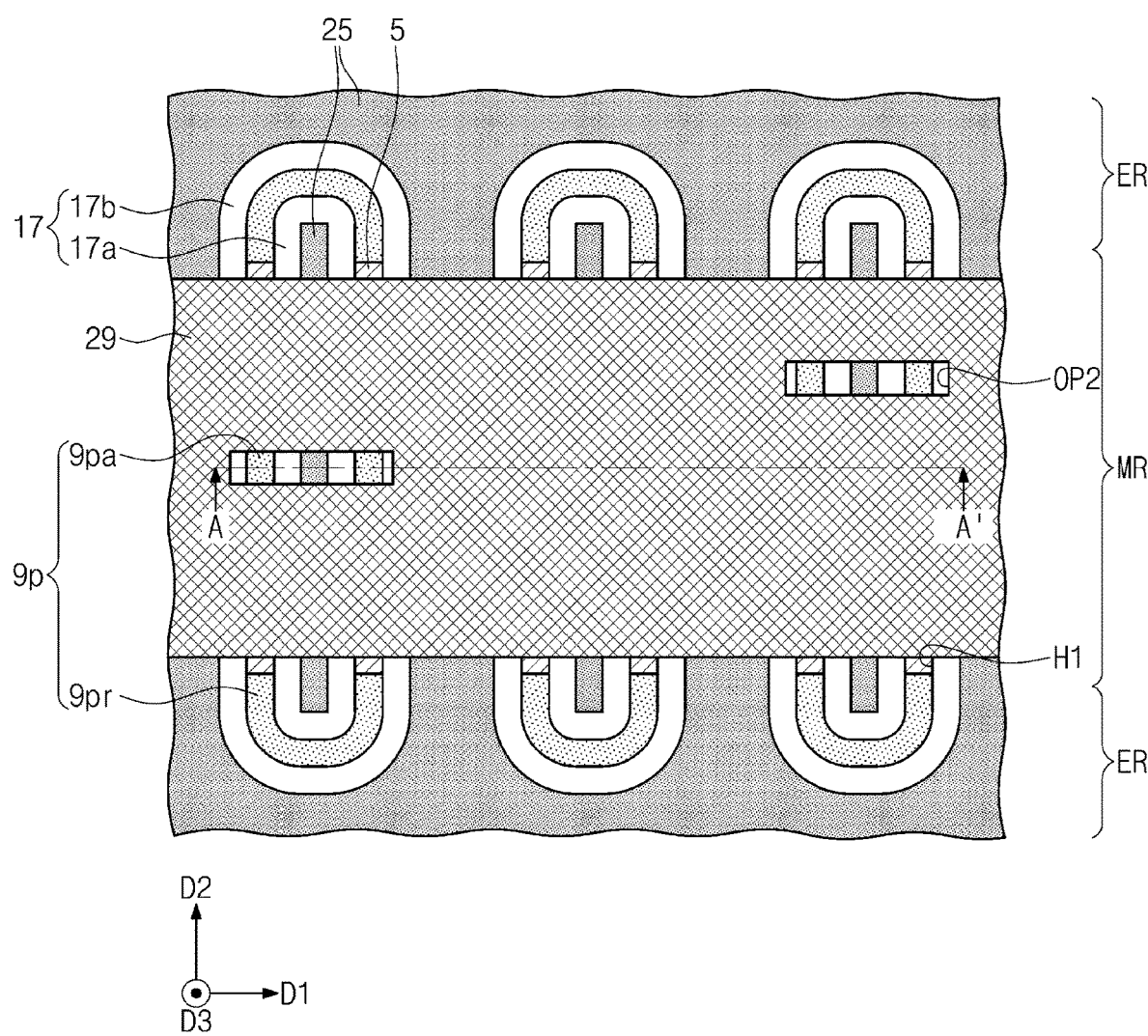
Figure 10B:
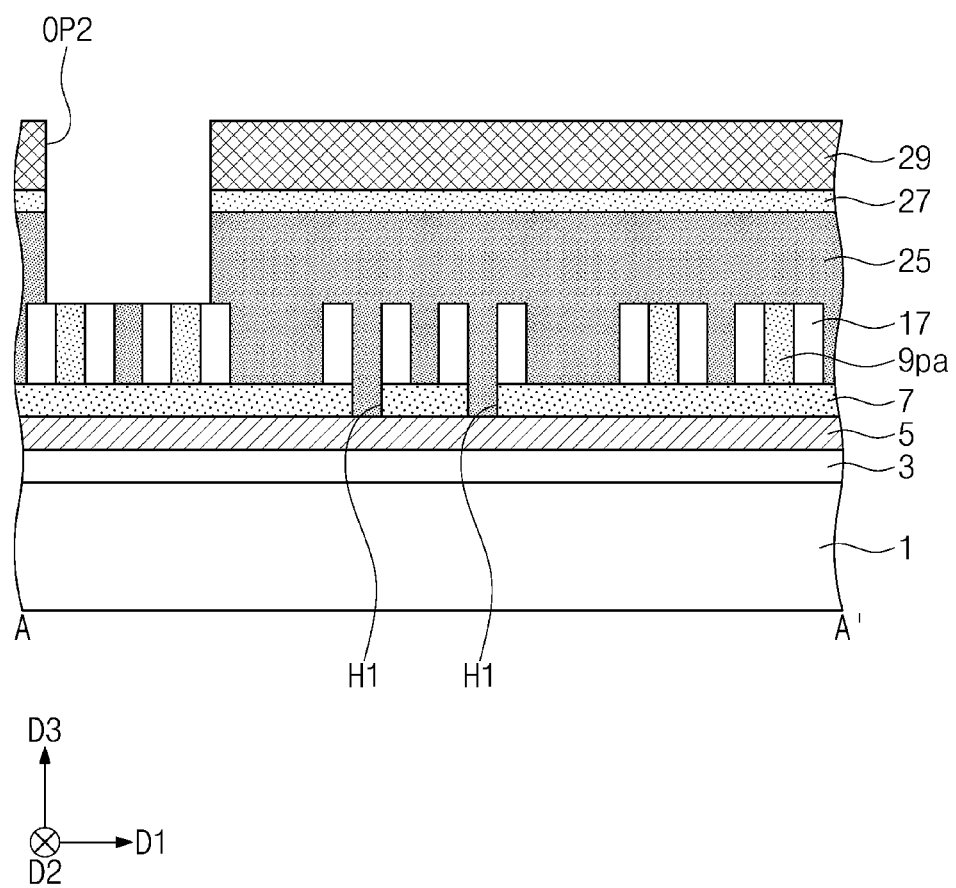
Figure 11A:
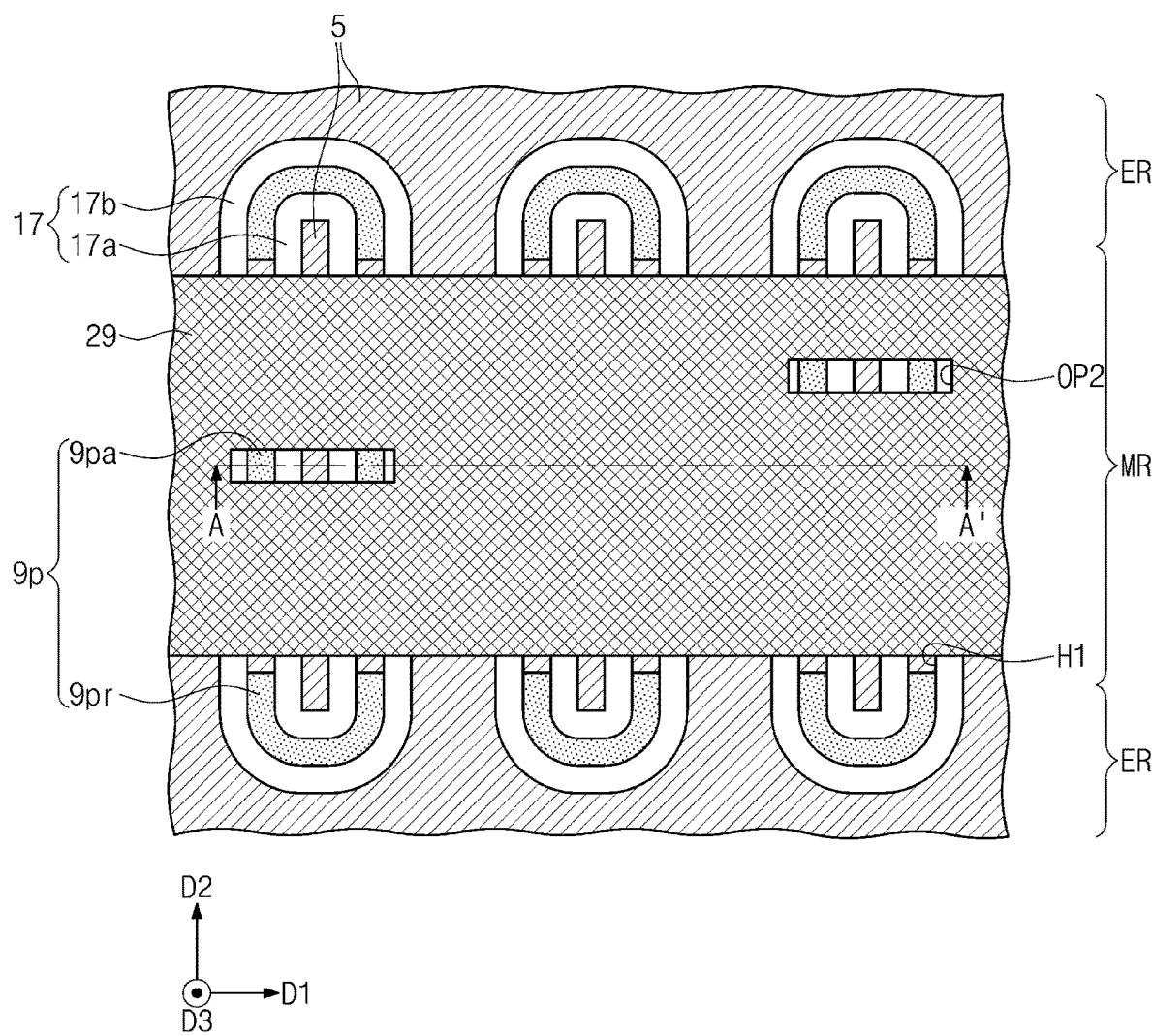
Figure 11B:
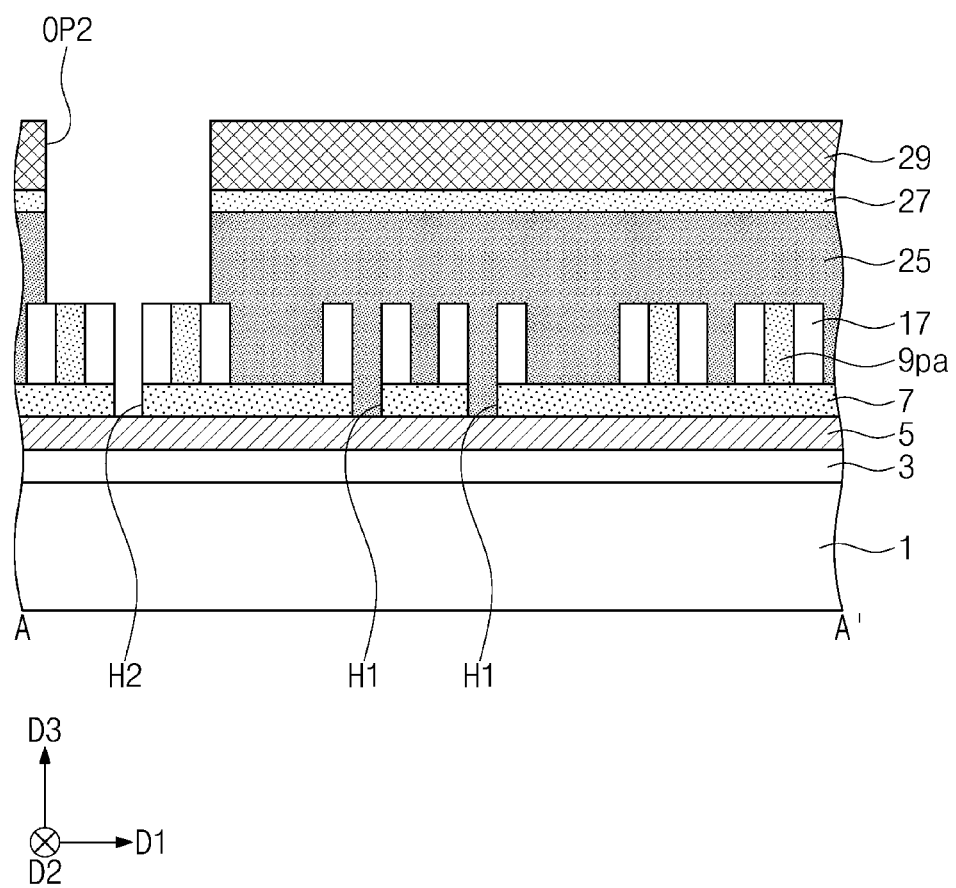
Figure 12A:
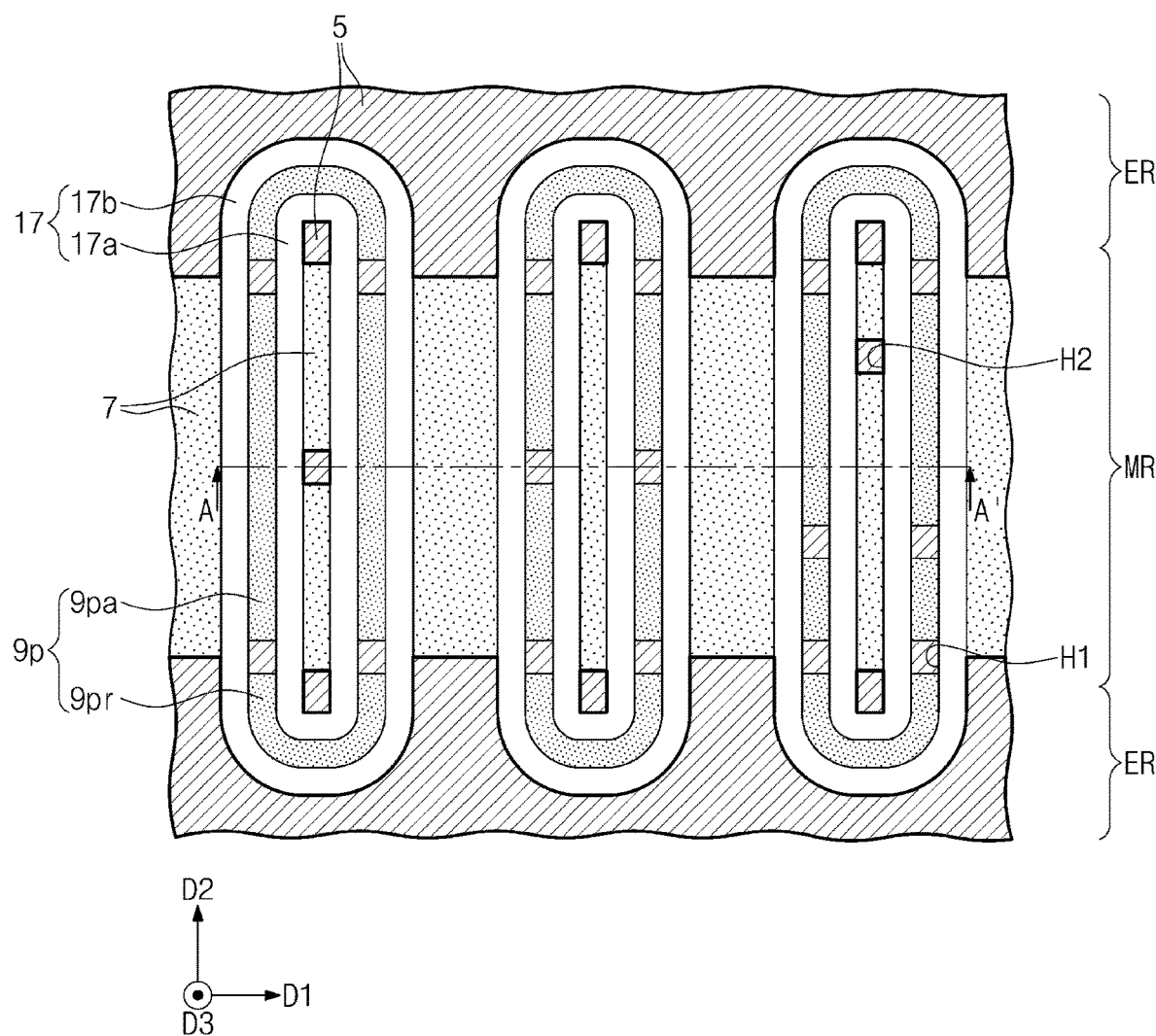
Figure 12B:
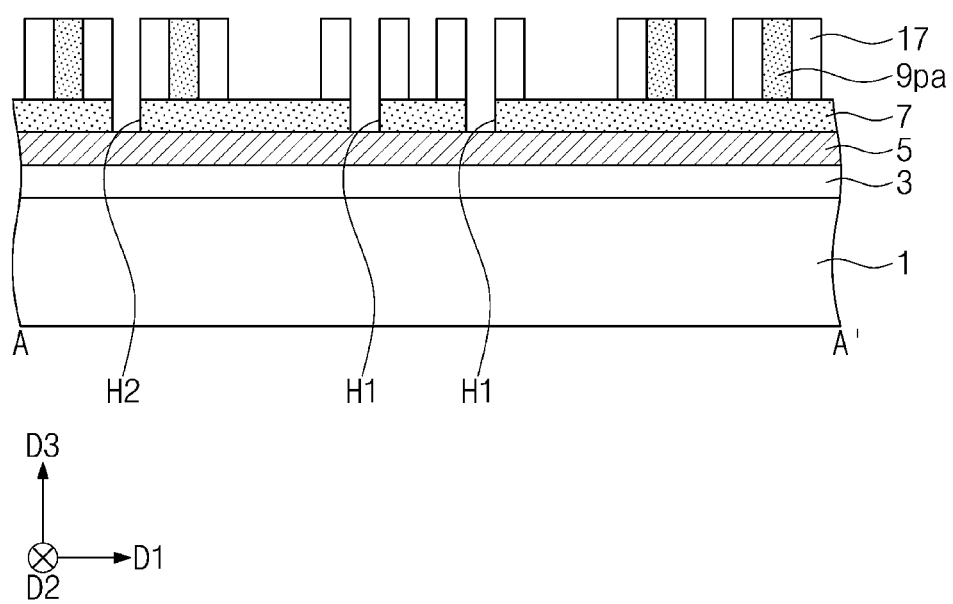
Figure 13A:
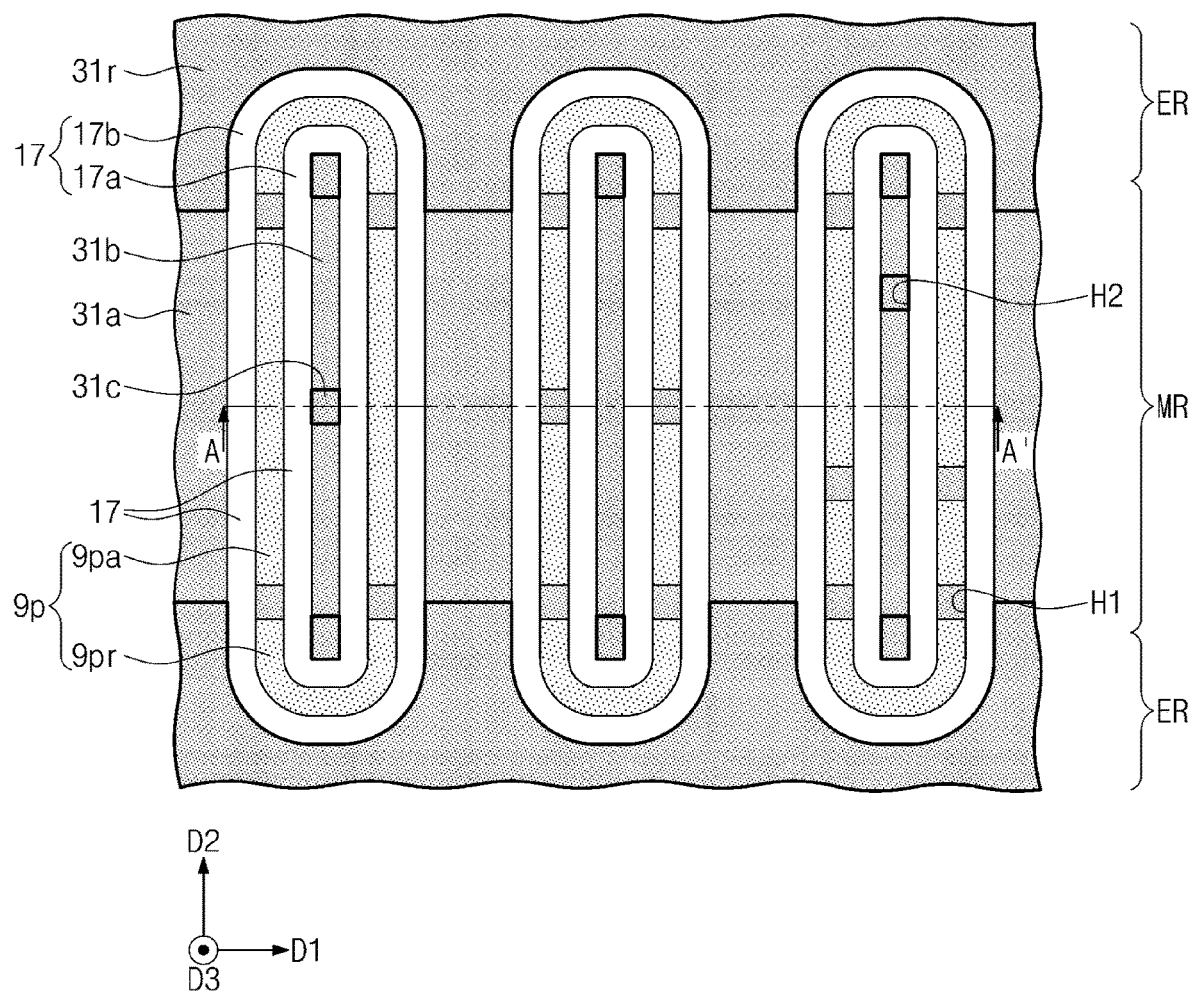
Figure 13B:
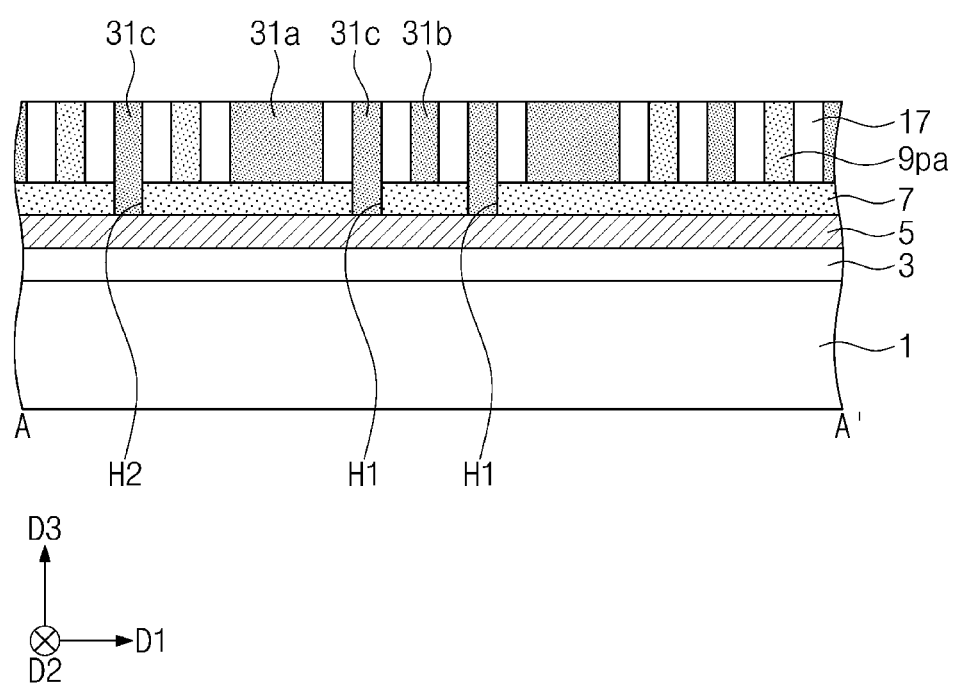
Figure 14A:
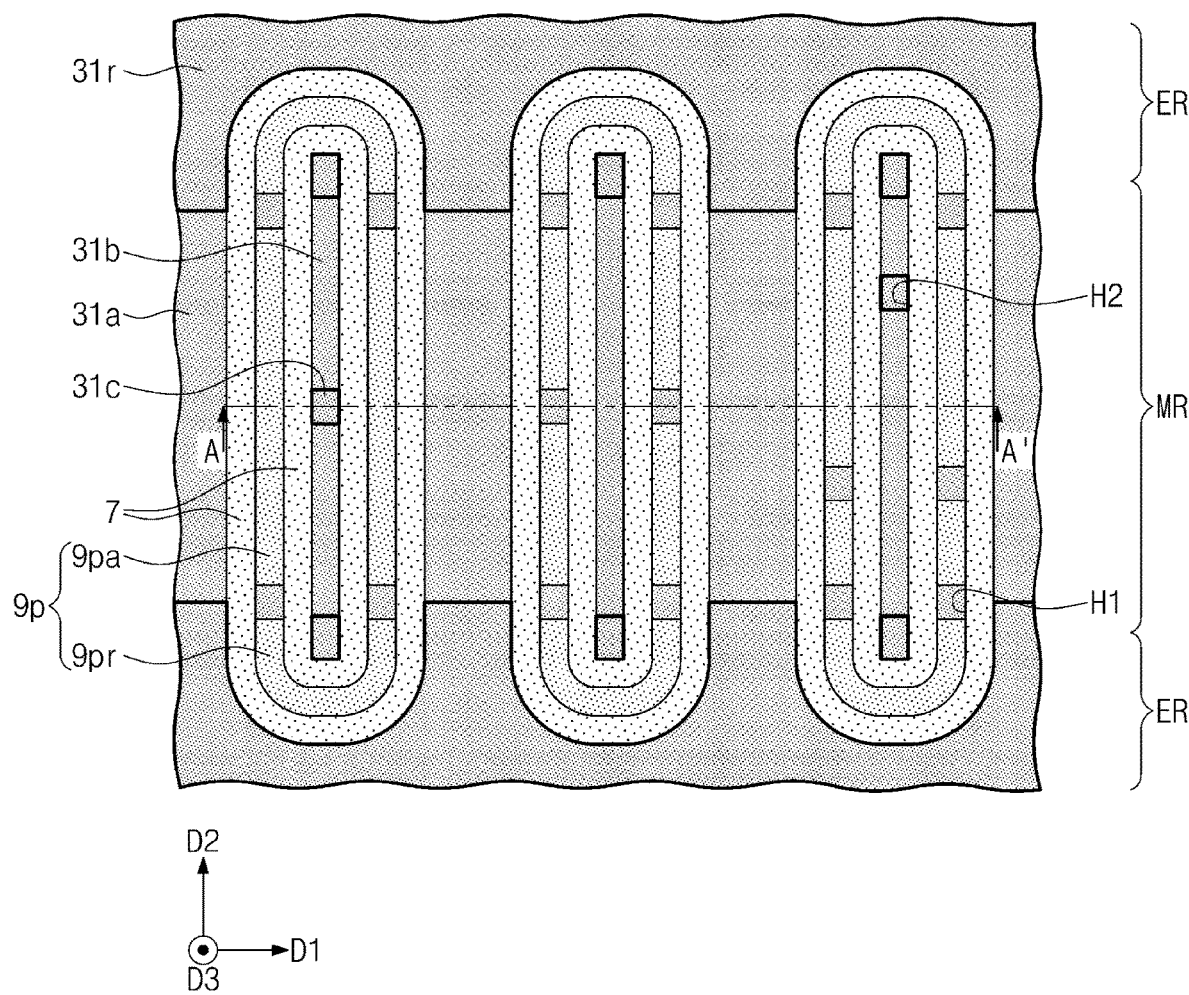
Figure 14B:
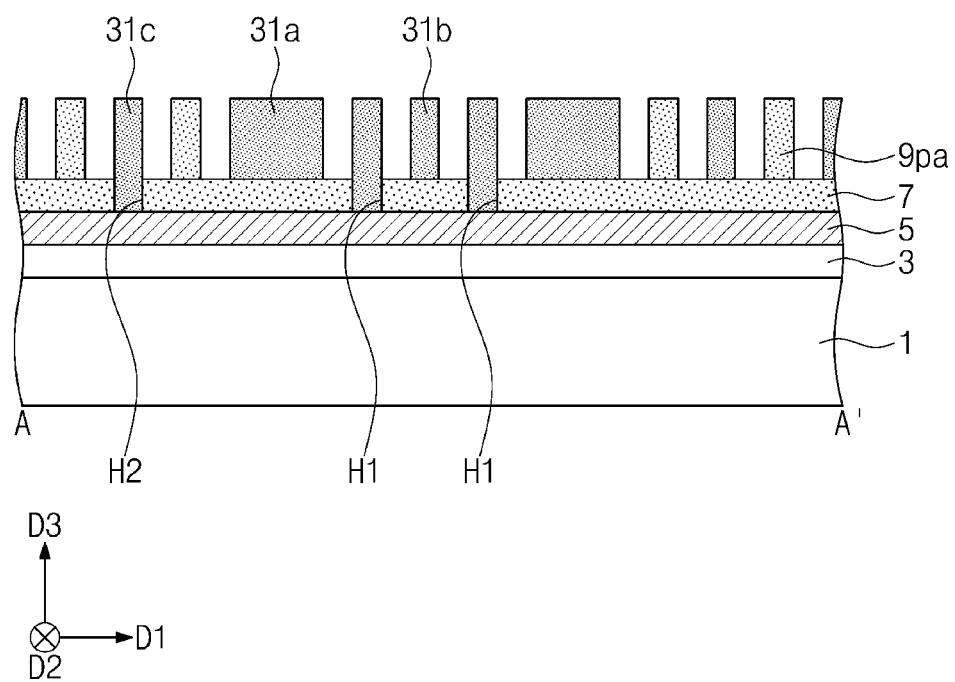
Figure 15A:
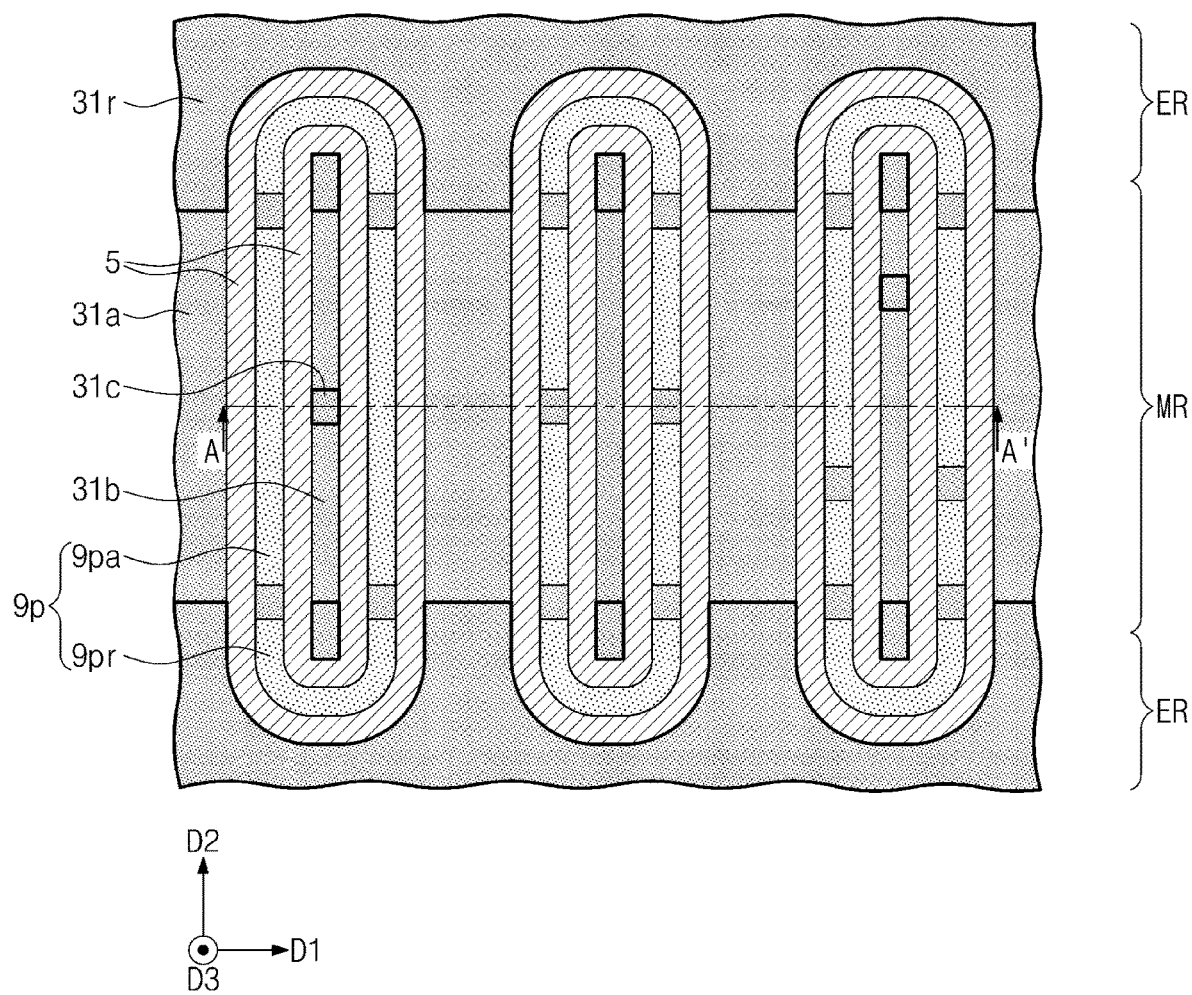
Figure 15B:
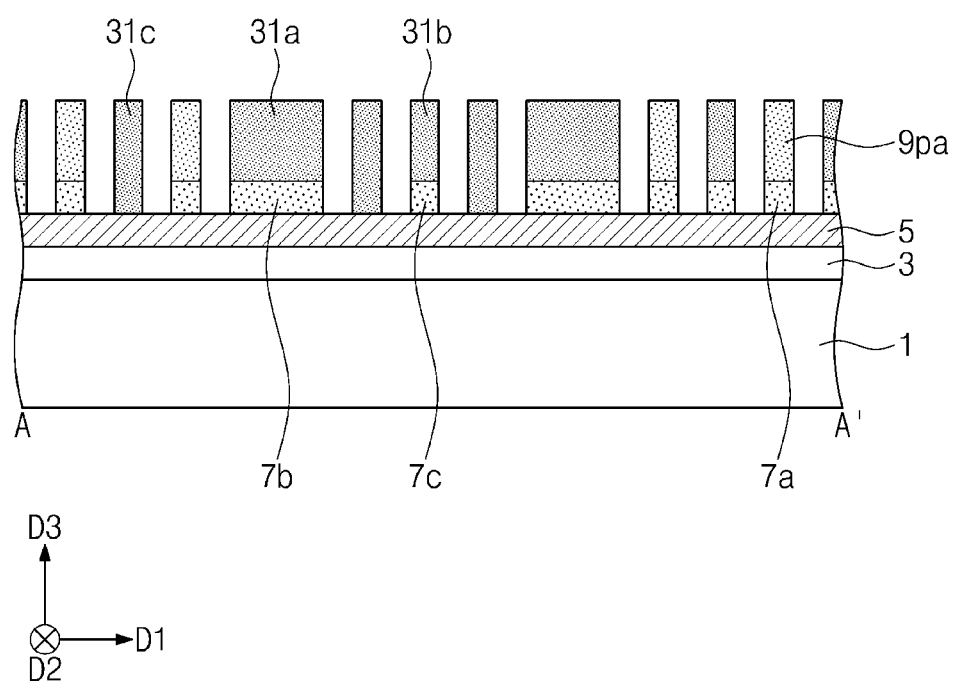
Figure 16A:
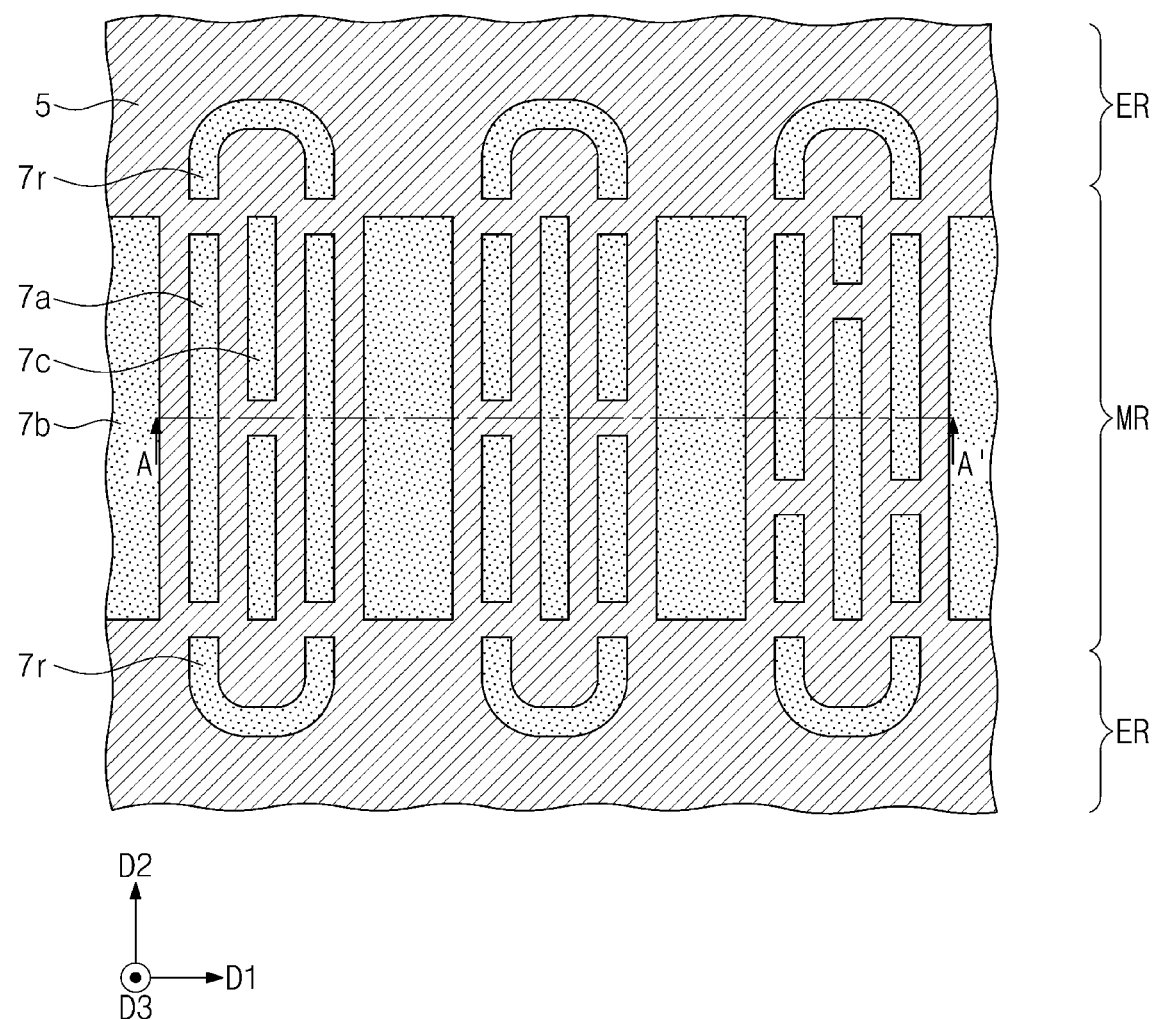
Figure 16B:
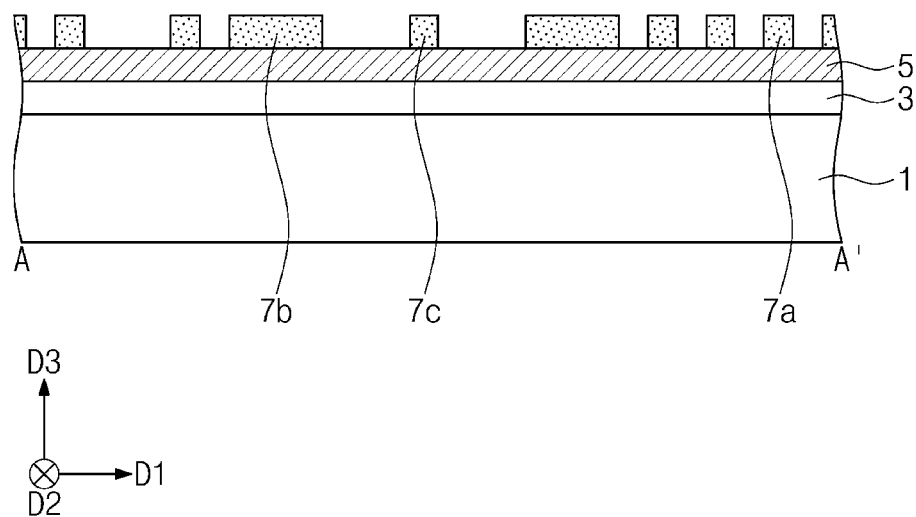

To do so, referring to FIGS. 10A and 10B, on the entire surface of the substrate 1, a second sacrificial fill layer 25 may be formed to fill the first holes H1 and to cover the first upper mask patterns 9p, the second sacrificial spacers 17, and the lower mask layer 7. The second sacrificial fill layer 25 may be formed by a method the same as that used for forming the first sacrificial fill layer 19 of FIG. 6B. A second antireflection layer 27 and a third photoresist pattern 29 may be formed on the second sacrificial fill layer 25. The second antireflection layer 27 may be formed of, for example, SiON. The third photoresist pattern 29 may cover the main region MR, and may not cover but expose the edge region ER. In addition, the third photoresist pattern 29 may have second openings OP2 on the main region MR. When viewed in plan, the second openings OP2 may be formed to have their bar or line shapes that elongate in the first direction D1.

The third photoresist pattern 29 may be used as an etching mask such that the second antireflection layer 27 and the second sacrificial fill layer 25 may be sequentially anisotropically etched to expose the top surfaces of the first upper mask patterns 9p and the top surfaces of the second sacrificial spacers 17. In this case, the second sacrificial fill layer 25 may be partially exposed between the second sacrificial spacers 17. On the main region MR, top surfaces of the upper line mask patterns Spa may be exposed. On the edge region ER, top surfaces of the upper residual mask patterns 9pr may be exposed, top surfaces of the second sacrificial spacers 17 covering sidewalls of the upper residual mask patterns 9pr may be exposed, and a portion of the second sacrificial fill layer 25 may be exposed.

Referring to FIGS. 10A, 10B, 11A, and 11B, among the second sacrificial spacers 17, the first upper mask patterns 9p, and the second sacrificial fill layer 25 that are exposed without being covered with the third photoresist pattern 29 (or that are exposed to the second openings OP2 or exposed on the edge region ER), the second sacrificial fill layer 25 may be selectively anisotropically etched and successively the lower mask layer 7 may be anisotropically etched to expose a top surface of the etching target layer 5. Therefore, second holes H2 may be formed on the main region MR. The second holes H2 may correspond to the second holes of FIG. 1.

The etching processes to etch the second sacrificial fill layer 25 and the lower mask layer 7 may be in-situ performed sequentially in a single etching chamber, which may result in a simplification of process.

The first holes H1 and the second holes H2 may be formed on locations where subsequently formed wiring lines are cut. The lower mask layer 7 may have the first and second holes H1 and H2 that are formed in advance, and thus it may be possible to form wiring lines having various lengths.

In the present inventive concepts, the second sacrificial spacers 17, the first upper mask patterns 9p, and the second sacrificial fill layer 25 that are exposed to the second openings OP2 may include their materials that are different from each other or that have different etch selectivity from each other, and the etch selectivity may be used to selectively remove patterns formed of specific materials, with the result that the second openings OP2 may be formed to have a relatively large width. Accordingly, it may be possible to increase a process margin and to prevent process failure such as bridge or short-circuit.

Referring to FIGS. 11A, 11B, 12A, and 12B, the second sacrificial fill layer 25, the second antireflection layer 27, and the third photoresist pattern 29 may be removed to expose the first upper mask patterns 9p, the second sacrificial spacers 17, and the top surface of the lower mask layer 7 and to reveal the first holes H1 and the second holes H2. On the edge region ER, the top surface of the etching target layer 5 may be considerably exposed.

Referring to FIG. 1, second upper mask patterns may be formed to fill spaces between the sacrificial spacers on the lower mask layer, and sacrificial patterns may be formed to fill the first holes and the second holes (S40).

To do so, referring to FIGS. 12A, 12B, 13A, and 13B, on the entire surface of the substrate 1, a third sacrificial fill layer (not shown) may be stacked and may then be blanket-anisotropically etched to form first, second, third, and fourth fill patterns 31a, 31b, 31c, and 31r. The third sacrificial fill layer may be formed of the same material and method as those used for forming the first and second sacrificial fill layers 19 and 25. For example, the third sacrificial fill layer may be formed of a spin-on-hardmask (SOH) layer.

The first fill patterns 31a and the second fill patterns 31b may fill spaces between the second sacrificial spacers 17 that are adjacent to each other on the lower mask layer 7. The first fill patterns 31a and the second fill patterns 31b may be collectively called the second upper mask patterns of FIG. 1. The first fill patterns 31a may fill spaces between the second outer sacrificial spacers 17b that are adjacent to each other on the lower mask layer 7 on the main region MR. The second fill patterns 31b may fill spaces between the second inner sacrificial spacers 17a that are adjacent to each other on the lower mask layer 7 on the main region MR. The third fill patterns 31c may fill the first holes H1 and the second holes H2. The third fill patterns 31c may be called the sacrificial patterns of FIG. 1. The fourth fill patterns 31r may be disposed on the edge region ER and may be in contact with the top surface of the etching target layer 5.

In the present inventive concepts, the sacrificial fill layers or the fill patterns 31a, 31b, 31c, and 31r may fill spaces between the second sacrificial spacers 17, and thus the second sacrificial spacers 17 may be reduced or prevented from collapse or shape deformation such as wiggling. Accordingly, it may be possible to prevent process failure and to increase a yield.

Referring to FIG. 1, the sacrificial spacers may all be removed (S50).

For example, referring to FIGS. 13A, 13B, 14A, and 14B, the second sacrificial spacers 17 may be removed to expose the top surface of the lower mask layer 7 between the first upper mask patterns 9p and the first and second fill patterns 31a and 31b. A selective isotropic etching process may be performed to remove the second sacrificial spacers 17.

Referring to FIG. 1, the first and second upper mask patterns may be used to etch the lower mask layer (S60).

For example, referring to FIGS. 14A, 14B, 15A, and 15B, an anisotropic etching process may be performed on the lower mask layer 7 exposed between the first upper mask patterns 9p and the first and second fill patterns 31a and 31b, and thus first, second, and third lower mask patterns 7a, 7b, and 7c may be formed, and the top surface of the etching target layer 5 may be exposed between the first, second, and third lower mask patterns 7a, 7b, and 7c. On the main region MR, the first lower mask pattern 7a may be formed below the upper line mask pattern Spa of the first upper mask pattern 9p. The second lower mask pattern 7b may be formed below the first fill pattern 31a. The third lower mask pattern 7c may be formed below the second fill pattern 31b. Although not shown in cross-section, on the edge region ER, a lower residual mask pattern (see 7r of FIG. 16A) may be formed below the upper residual mask pattern 9pr.

Referring to FIG. 1, the sacrificial patterns may be removed (S70).

For example, referring to FIGS. 15A, 15B, 16A, and 16B, at least the third fill patterns 31c may be removed. In this case, the first upper mask patterns 9p and the first, second, and fourth fill patterns 31a, 31b, and 31r may also be removed. Therefore, the first, second, and third lower mask patterns 7a, 7b, and 7c and the lower residual mask pattern 7r may be exposed at their top surface, and the top surface of the etching target layer 5 may be exposed between the lower mask patterns 7a, 7b, 7c, and 7r. A selective isotropic etching process may be removed to remove the first upper mask patterns 9p and the first, second, third, and fourth fill patterns 31a, 31b, 31c, and 31r. The first upper mask patterns 9p and the first, second, and fourth fill patterns 31a, 31b, and 31r may partially remain.

Referring to FIGS. 16A, 16B, 17A, and 17B, the first, second, and third lower mask patterns 7a, 7b, and 7c and the lower residual mask pattern 7r may be used as an etching mask such that the etching target layer 5 may be anisotropically etched to form first, second, and third line patterns 5a, 5b, and 5c that extend in the second direction D2 on the main region MR and also to form a residual pattern 5r on the edge region ER. The first line patterns 5a may be formed below the first lower mask pattern 7a. The second line patterns 5b may be formed below the second lower mask pattern 7b. The third line patterns 5c may be formed below the third lower mask pattern 7c. The residual pattern 5r may be formed below the lower residual mask pattern 7r. The method mentioned above may fabricate a semiconductor device 1000.

Figure 17A:
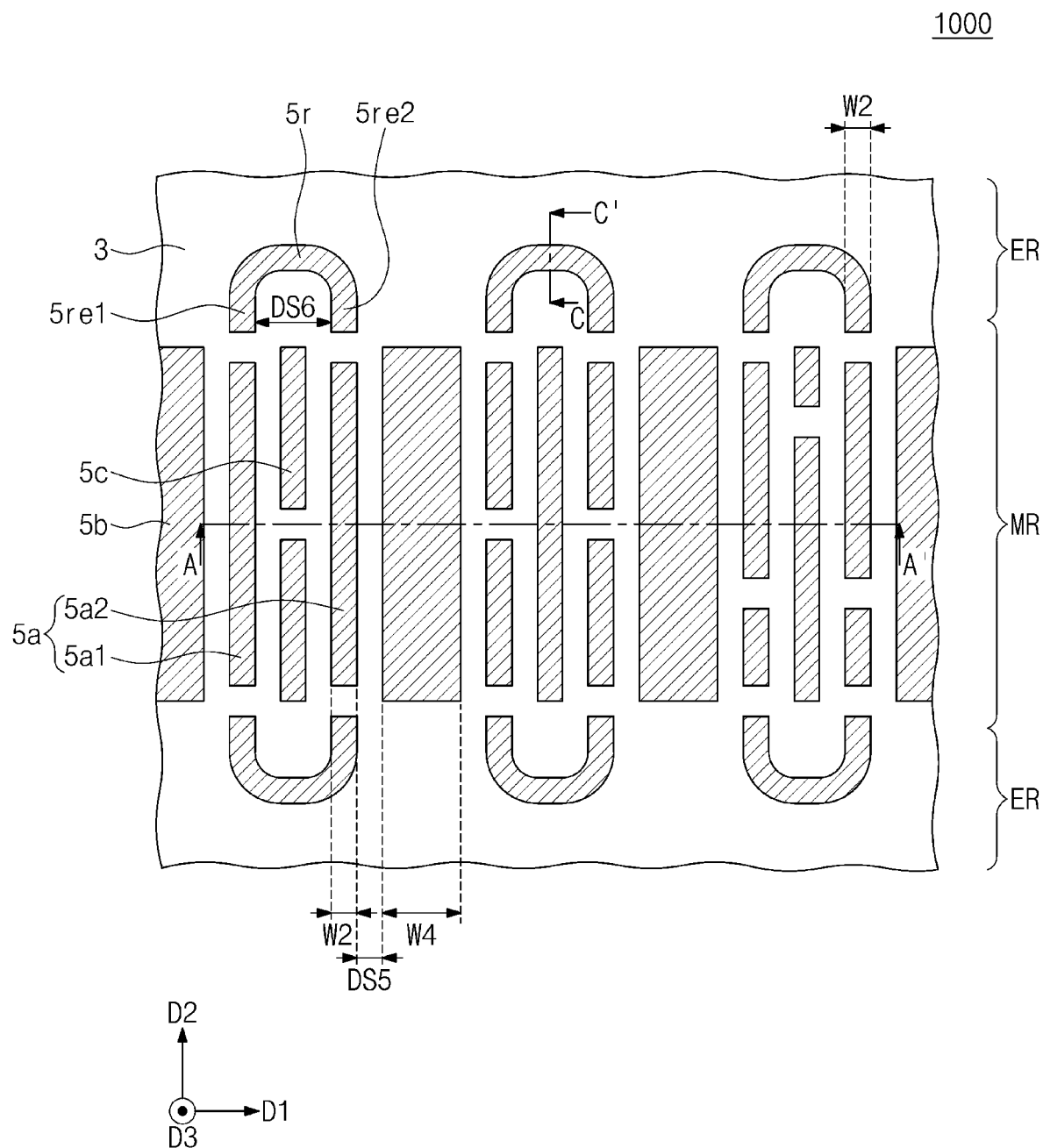
Figure 17B:
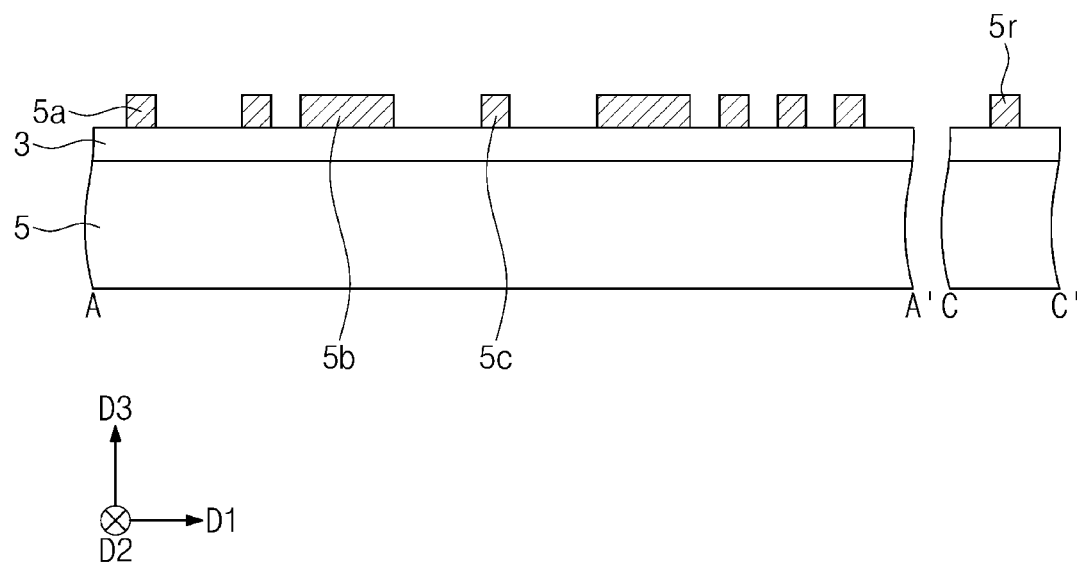
FIG. 17B illustrates a cross-sectional view taken along lines A-A' and C-C' of FIG. 17A.

Referring to FIGS. 17A and 17B, the semiconductor device 1000 according to some embodiments of the present inventive concepts may be configured such that the first, second, and third line patterns 5a, 5b, and 5c may be spaced apart from each other at the fifth distance DS5 in the first direction D1. Two first line patterns 5a that are adjacent to each other in the first direction D1 may include a first left line pattern 5a1 and a first right line pattern 5a2. A single third line pattern 5c may be disposed between the first left line pattern 5a1 and the first right line pattern 5a2. The third line pattern 5c, the first left line pattern 5a1, and the first right line pattern 5a2 may each have the second width W2 and may be spaced apart from each other at the fifth distance DS5 in the first direction D1. The residual pattern 5r may have an arc or U shape when viewed in plan. The residual pattern 5r may have a first end 5re1 adjacent to the first left line pattern 5a1 and a second end 5re2 adjacent to the first right line pattern 5a2. The first end 5re1 and the second end 5re2 may each have the second width W2. The first end 5re1 may be aligned with the first left line pattern 5a1 in the second direction D2. The second end 5re2 may be aligned with the first right line pattern 5a2 in the second direction D2.

A sixth distance DS6 between the first and second ends 5re1 and 5re2 may be the same as a sum of twice the fifth distance DS5 and the second width W2. The second line pattern 5b may have a fourth width W4. The fourth width W4 may be equal to or greater than the second width W2. In the present embodiment, the fourth width W4 may be about three times the second width W2. In the present embodiment, the second width W2 may be the same as the fifth distance DS5. The second width W2 and the fifth distance DS5 may each range, for example, from about 5 nm to about 9 nm. In addition, a sum of the second width W2 and the fifth distance DS5 may range from about 10 nm to about 18 nm.

A semiconductor device according to some embodiments of the present inventive concepts may be fabricated by a method capable of preventing defect failure, and thus the semiconductor device may thus have improved reliability and increased density.

FIGS. 18A to 20A illustrate plan views showing a method of fabricating a semiconductor device according to some embodiments of the present inventive concepts. FIGS. 18B to 20B illustrate cross-sectional views taken along line A-A' of FIGS. 18A to 20A, respectively.

Figure 18A:
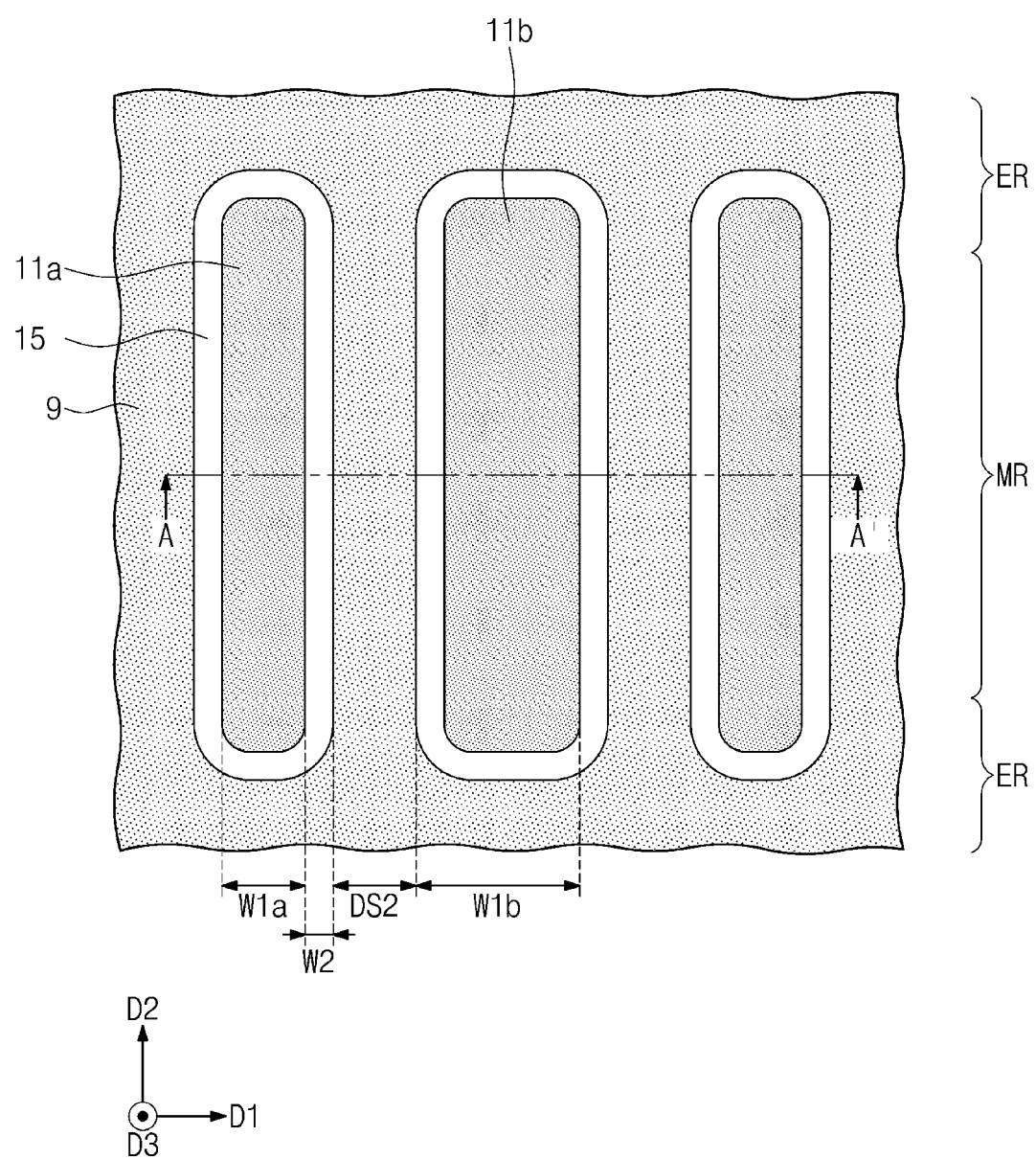
Figure 18B:
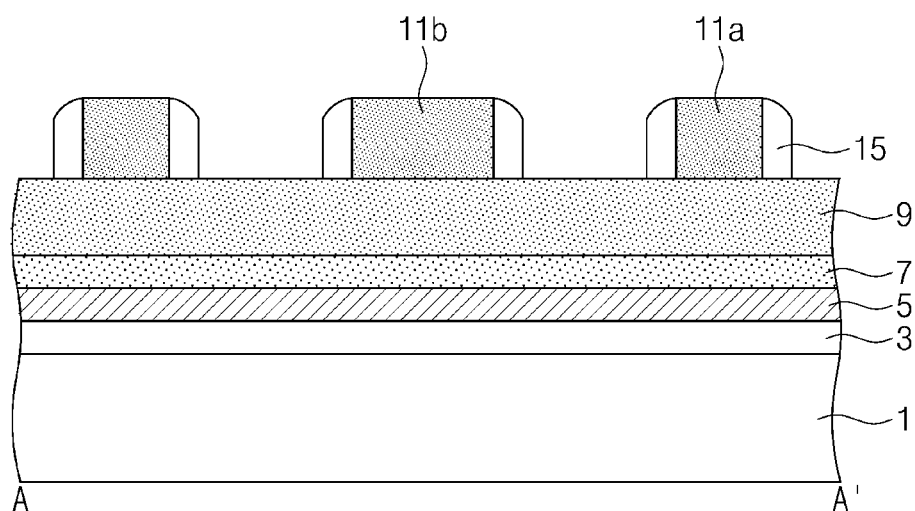
Figure 18B:
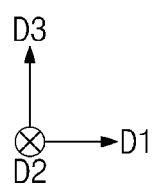

Referring to FIGS. 18A and 18B, as discussed with reference to FIGS. 2A, 2B, 3A, and 3B, the first photoresist patterns 13 may be used as an etching mask to etch the sacrificial mask layer 11 to form first and second sacrificial mask patterns 11a and 11b. In addition, the first sacrificial spacers 15 may be formed to cover sidewalls of the first and second sacrificial mask patterns 11a and 11b.

The first sacrificial mask pattern 11a may be formed to have a width W1a. The second sacrificial mask pattern 11b may be formed to have a width W1b. The first sacrificial spacers 15 may be formed to each have a second width W2. Neighboring first sacrificial spacers 15 may be spaced apart from each other at a second distance DS2 in the first direction D1. In the present embodiment, the width W1a and the second distance DS2 may each be about three times the second width W2, and the width W1b may be about five times the second width W2.

Figure 19A:
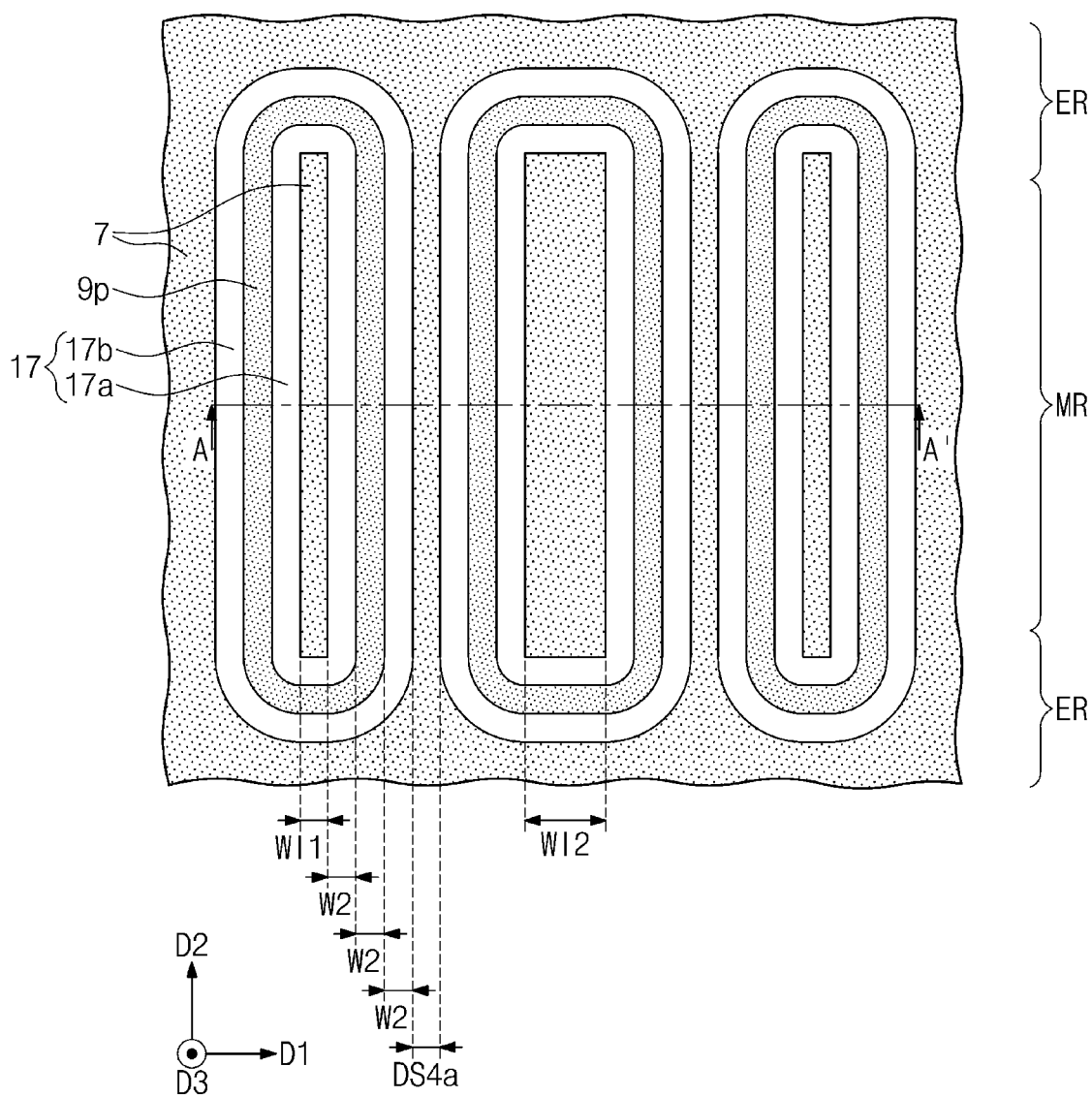
Figure 19B:
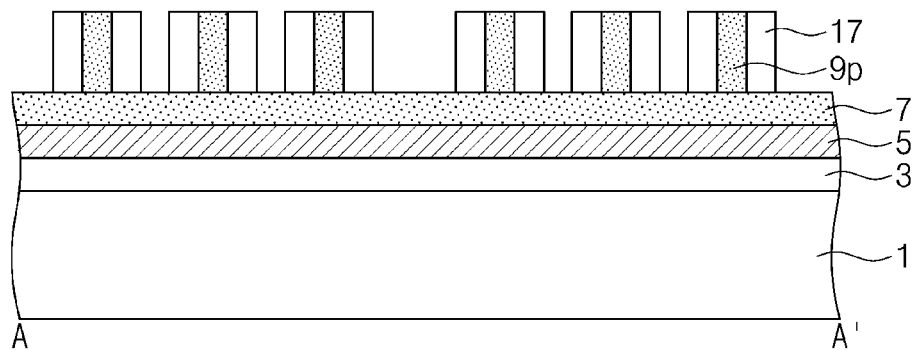
Figure 19B:
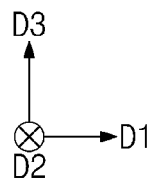

Referring to FIGS. 19A and 19B, as discussed with reference to FIGS. 4A, 4B, 5A, and 5B, the first upper mask patterns 9p may be formed, and the second sacrificial spacers 17 may be formed to cover sidewalls of the first upper mask patterns 9p. In this case, the second sacrificial spacers 17 may be formed to each have the second width W2. Neighboring second outer sacrificial spacers 17b may be spaced apart in the first direction D1 at a distance DS4a. The second inner sacrificial spacers 17a may each have an empty inner space. A first neighboring the second inner sacrificial spacers 17a may be spaced apart at an inner space having a first inner width WI1 in the first direction D1. A second neighboring the second inner sacrificial spacers 17a may be spaced apart at an inner space having a second inner width WI2 in the first direction D1. In the present embodiment, the first inner width WI1 may be the same as the second width W2. The second inner width WI2 may be about three times the second width W2.

Figure 20A:
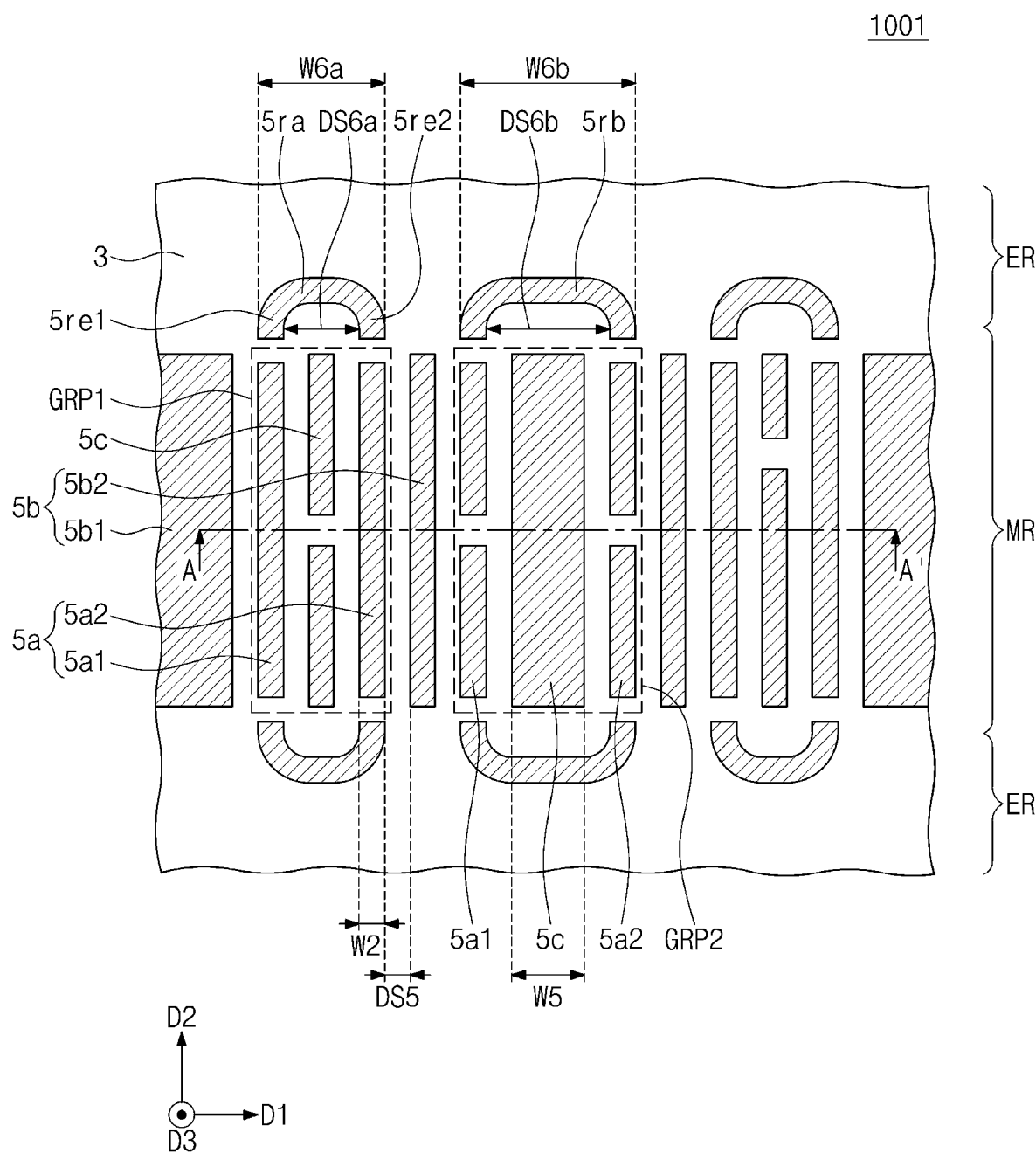
Figure 20B:
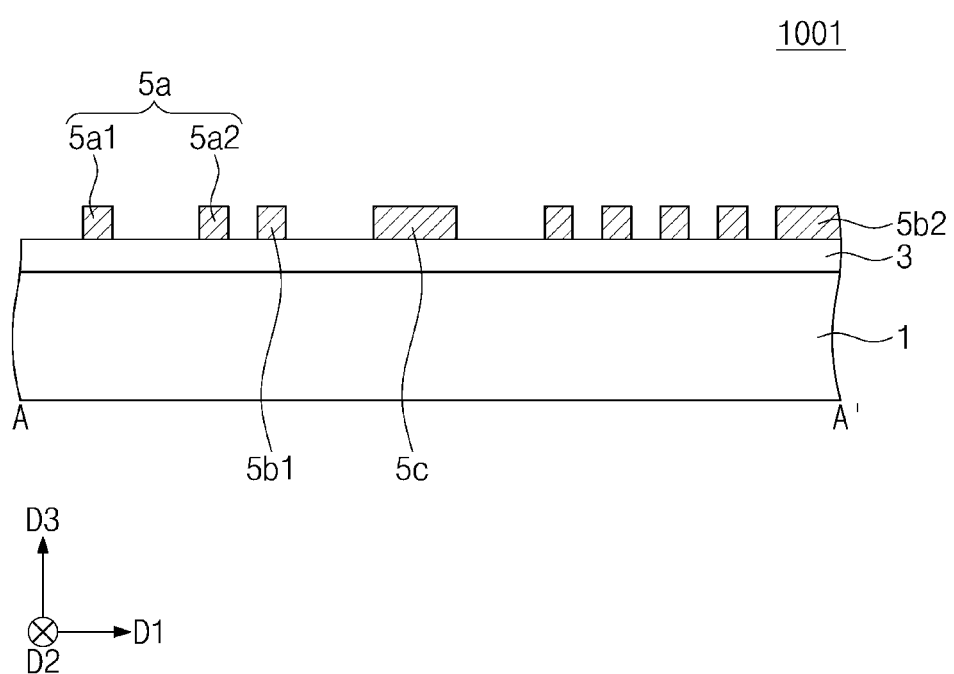

Referring to FIGS. 20A and 20B, a semiconductor device 1001 may be fabricated by performing subsequent processes that are discussed with reference to FIGS. 6A to 17A and 6B to 17B. The semiconductor device 1001 according to some embodiments of the present inventive concept may be configured such that the substrate 1 may be provided thereon with the first line patterns 5a, the second line patterns 5b, the third line patterns 5c, first residual patterns 5ra, and second residual patterns 5rb. The first residual pattern 5ra may be adjacent to the first and third line patterns 5a and 5c that constitute a first group GRP1. The second residual pattern 5rb may be adjacent to the first and third line patterns 5a and 5c that constitute a second group GRP2.

The third line pattern 5c of the first group GRP1 may have the second width W2 in the first direction D1. The third line pattern 5c of the second group GRP2 may have a fifth width W5 in the first direction D1. Each of the first left line pattern 5a1 and the first right line pattern 5a2 of each of the first group GRP1 and the second group GRP2 may have the second width W2 in the first direction D1. In the present embodiment, the fifth width W5 may be about three times the second width W2. A distance DS6a between the first and second ends 5re1 and 5re2 of the first residual pattern 5ra may be a sum of twice the fifth distance DS5 and the second width W2. A distance DS6b between the first and second ends 5re1 and 5re2 of the second residual pattern 5rb may be a sum of twice the fifth distance DS5 and the fifth width W5. In the present embodiment, the distance DS6a may be about three times the second width W2, and the distance DS6b may be about five times the second width W2.

The first residual pattern 5ra may have a width W6a in the first direction D1. The second residual pattern 5rb may have a width W6b in the first direction D1 different from the width W6a in the first direction D1. In the present embodiment, the width W6b may be greater than the width W6a. For example, the width W6a may be about five times the second width W2, and the width W6b may be about seven times the second width W2.

The second line patterns 5b may include a second right line pattern 5b2 between the first group GRP1 and the second group GRP2, and may also include a second left line pattern 5b1 on a left side of the first group GRP1. The second right line pattern 5b2 may have the second width W2. The second left line pattern 5b1 may have a width equal to or greater than the second width W2. Other configurations may be identical or similar to those discussed with reference to FIGS. 17A and 17B.

The line patterns 5a, 5b, and 5c of FIGS. 17A and 20A may correspond to wiring patterns of a semiconductor device. For example, a power line to which one of ground and power voltages is applied may correspond to the second line patterns 5b of FIG. 17A or the third line pattern 5c of the second group GRP2 of FIG. 20A, which line patterns 5b and 5c have relatively large widths among the line patterns 5a, 5b, and 5c. A normal signal line may correspond to the line patterns 5a, 5b, and 5c each having the second width W2.

Figure 21A:
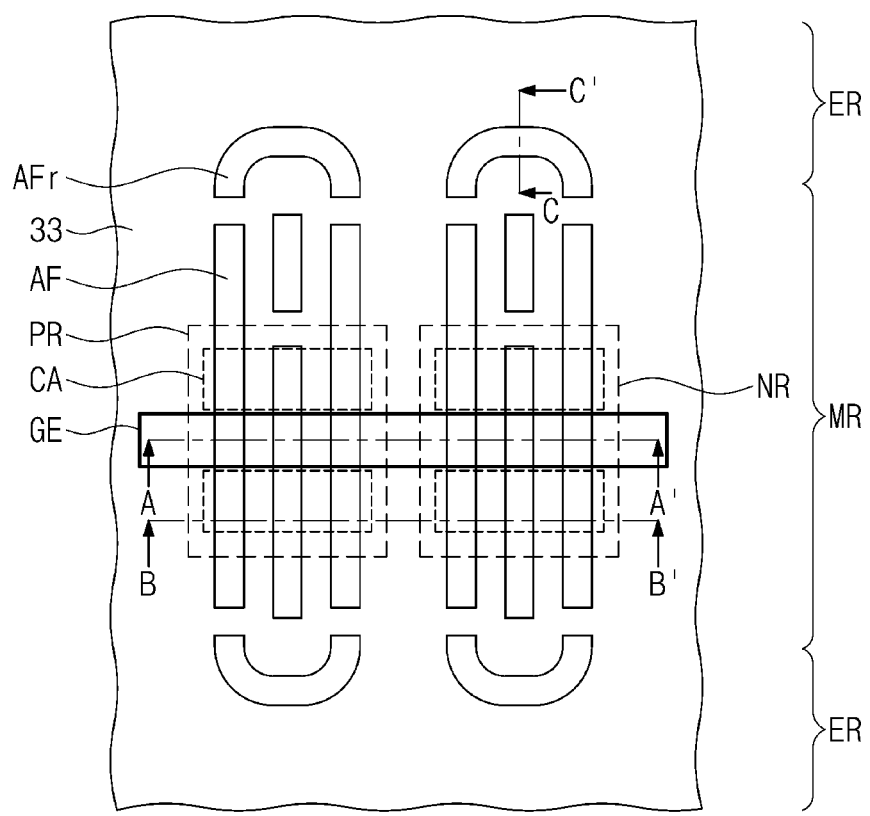
FIG. 21A illustrates a plan view showing a semiconductor device according to some embodiments of the present inventive concepts.
Figure 21A:
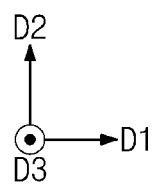
Figure 21B:
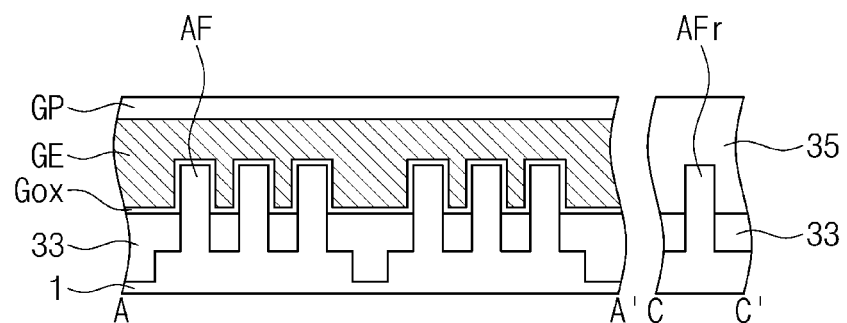
FIG. 21B illustrate a first cross-sectional view taken along lines A-A' and C-C' of FIG. 21A.
Figure 21C:
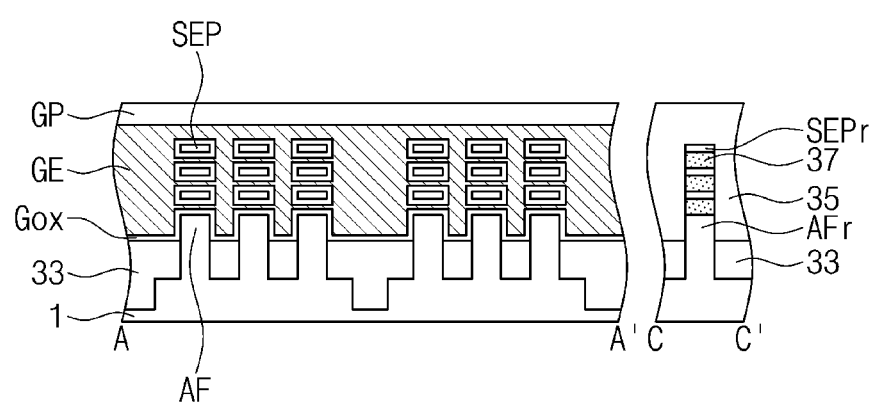
FIG. 21C illustrates a second cross-sectional view taken along lines A-A' and C-C' of FIG. 21A.

FIG. 21A illustrates a plan view showing a semiconductor device according to some embodiments of the present inventive concepts. FIG. 21B illustrate a first cross-sectional view taken along lines A-A' and C-C' of FIG. 21A. FIG. 21C illustrates a second cross-sectional view taken along lines A-A' and C-C' of FIG. 21A.

Referring to FIGS. 21A and 21B, a semiconductor device 1002 may be provided with a substrate 1 including a main region MR and an edge region ER. A plurality of fins AF and AFr may protrude from the substrate 1. A device isolation layer 33 may be disposed between the fins AF and AFr. The device isolation layer 33 may have a top surface lower than those of the fins AF and AFr. The device isolation layer 33 may expose upper sidewalls of the fins AF and AFr. The fins AF and AFr may be integrally connected to the substrate 1 and may be portions of the substrate 1. The fins AF and AFr may include active fins AF provided on the main region MR and residual fins AFr provided on the edge region ER. When viewed in plan, the active fins AF may have a bar or line shape that extends in a second direction D2 on the main region MR. The residual fins AFr may have an arc or U shape when viewed in plan.

The fins AF and AFr may be formed by using the method discussed with reference to FIGS. 2A to 20A and 2B to 20B. For example, the lower mask patterns 7a, 7b, and 7c of FIG. 16A may be used to etch the substrate 1 to form the fins AF and AFr.

The substrate 1 may include a p-type metal-oxide-semiconductor (PMOS) area or PMOS transistor area PR and an n-type metal-oxide-semiconductor (NMOS) area or NMOS transistor area NR that are adjacent to each other on the main region MR. For example, three active fins AF may be disposed on each of the PMOS area PR and the NMOS area NR. A gate electrode GE may run across the PMOS area PR and the NMOS area NR. The gate electrode GE may cover top surfaces and sidewalls of the active fins AF.

A gate dielectric layer Gox may be interposed between the gate electrode GE and the active fins AF. A gate capping pattern GP may be provided on the gate electrode GE. On the edge region ER, the residual fin AFr may be covered with an interlayer dielectric layer 35.

Figure 23A:
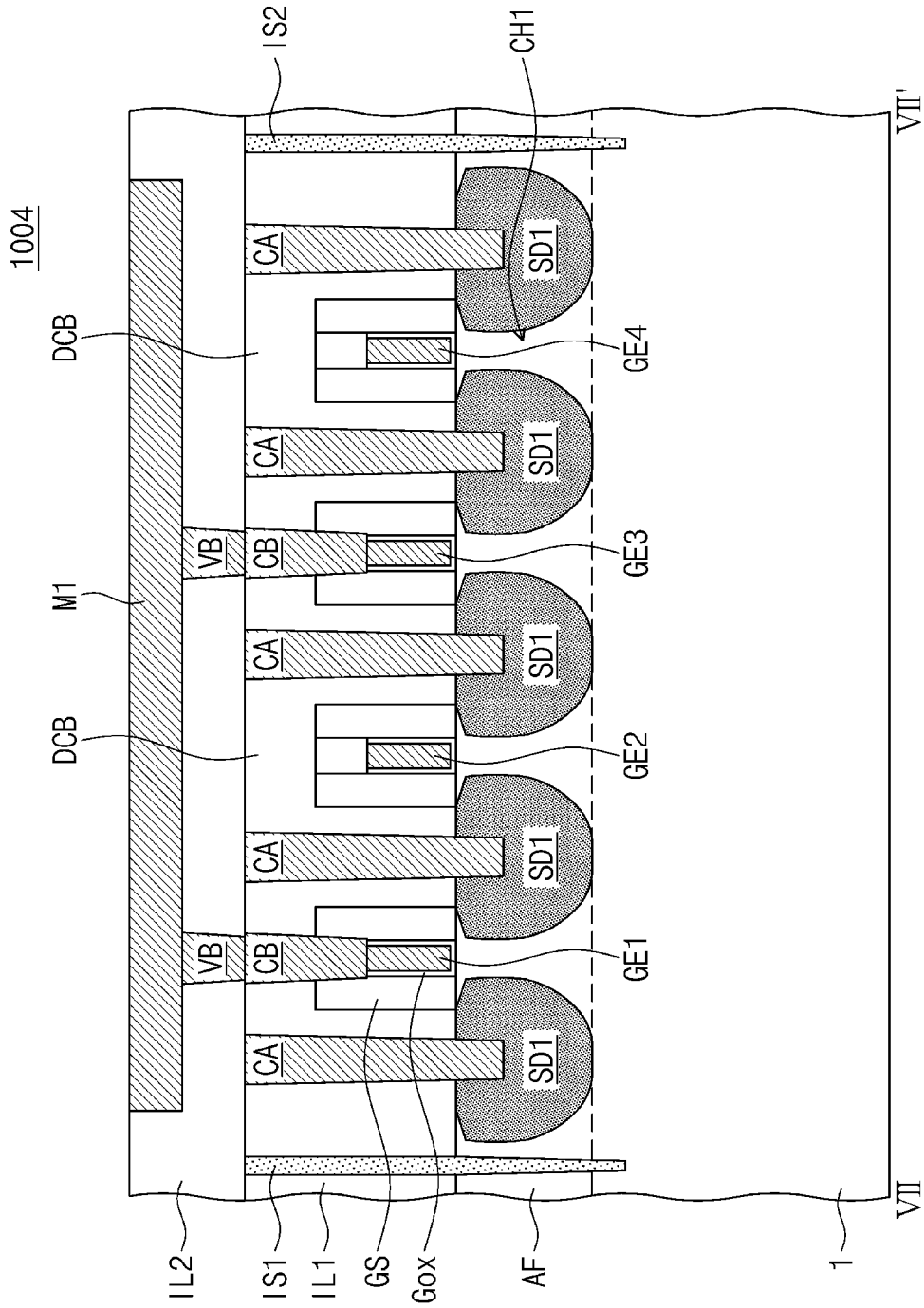
FIGS. 23A, 23B, and 23C illustrate cross-sectional views taken along lines VII-VII', VIII-VIII', and IX-IX' of FIG. 22, respectively.
Figure 23B:
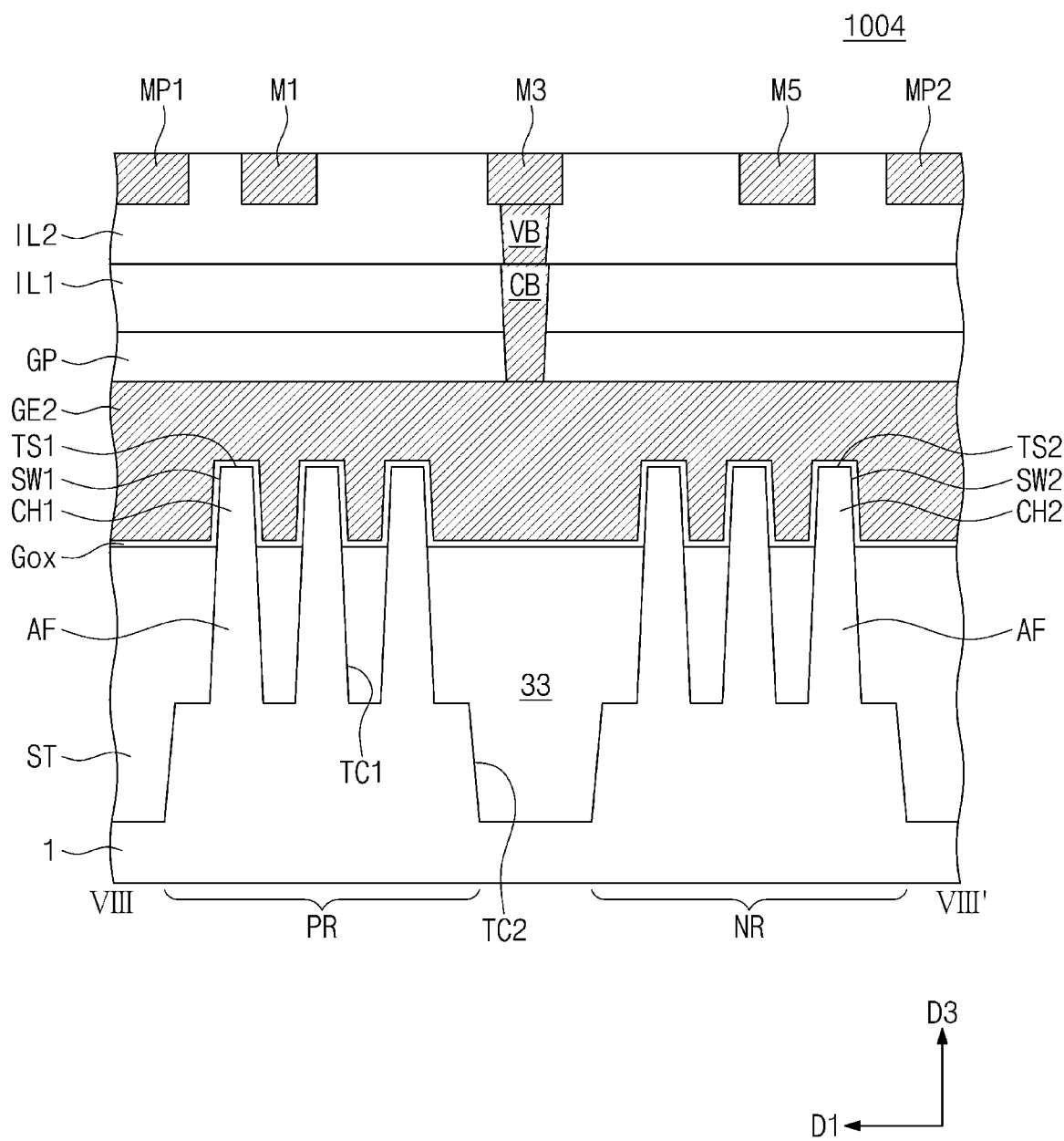
Figure 23C:
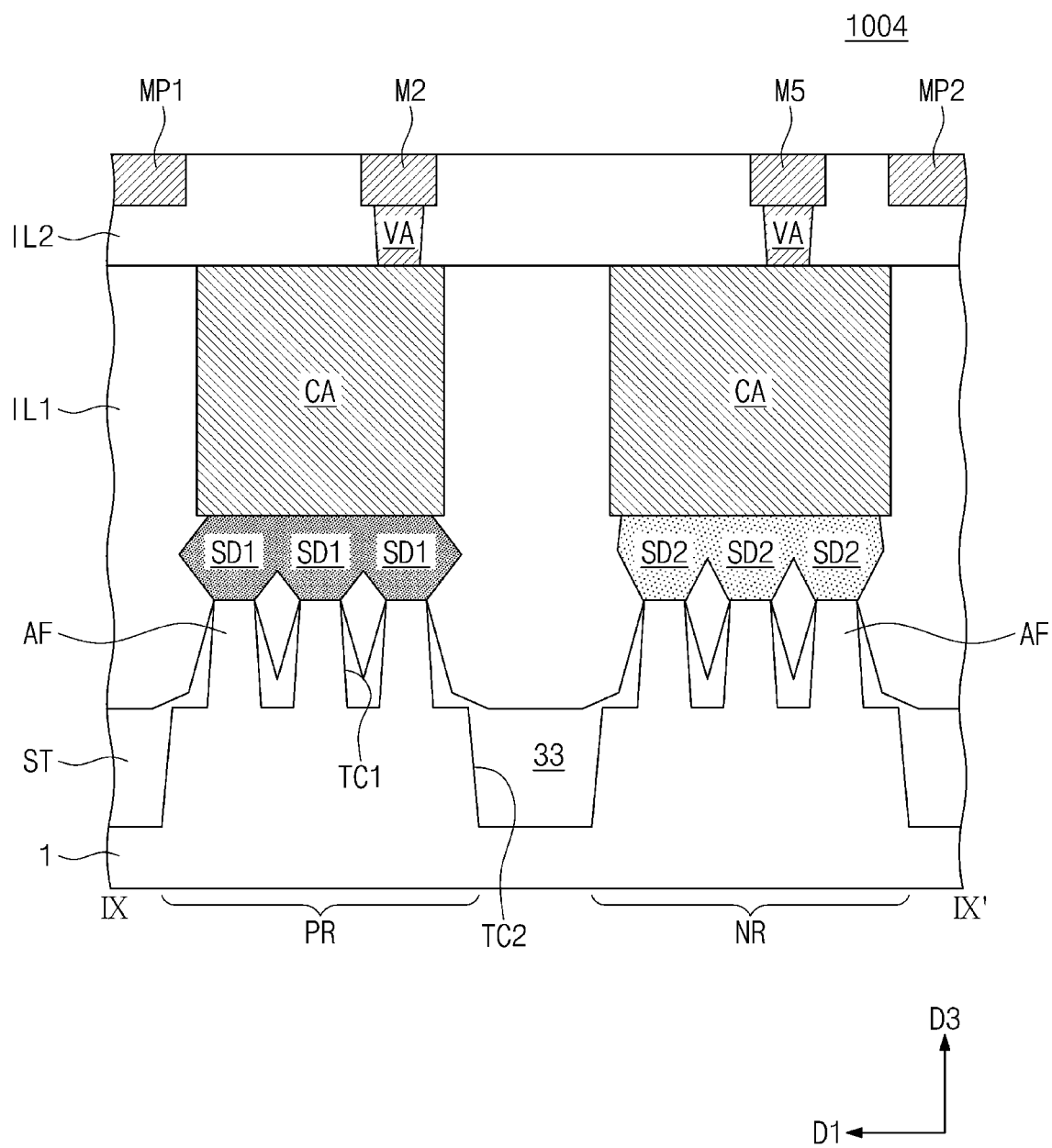

A cross-section taken along line B-B' of FIG. 21A may be similar to FIG. 23C. Referring to FIGS. 21A and 23C, source/drain patterns SD1 and SD2 may be disposed on the active fins AF on opposite sides of the gate electrode GE. Source/drain contacts CA may be disposed on the source/drain patterns SD1 and SD2.

For example, the semiconductor device 1002 of FIG. 21B may be a fin field effect transistor (FinFET).

Referring to FIGS. 21A and 21C, a semiconductor device 1003 according to the present embodiment may be configured such that a plurality of semiconductor patterns SEP may be sequentially stacked on the active fin AF. A portion of the gate electrode GE may be interposed between the semiconductor patterns SEP and between a lowermost semiconductor pattern SEP and the active fin AF. The gate dielectric layer Gox may be interposed between the gate electrode GE and the semiconductor patterns SEP. A plurality of residual semiconductor patterns SEPr may be sequentially stacked on the residual fin AFr. A residual sacrificial pattern 37 may be interposed between the residual semiconductor patterns SEPr and between a lowermost residual semiconductor pattern SEPr and the residual fin AFr. For example, the residual sacrificial pattern 37 may include silicon-germanium (SiGe). The residual semiconductor pattern SEPr and the semiconductor patterns SEP may include silicon (Si). The residual semiconductor pattern SEPr and the residual sacrificial pattern 37 may have the same planar shape as that of the residual fin AFr. Other configurations may be identical or similar to those discussed with reference to FIGS. 21A and 21B. The semiconductor device 1003 of FIG. 21C may be a multi-bridge channel field effect transistor (MBCFET).

Figure 22:
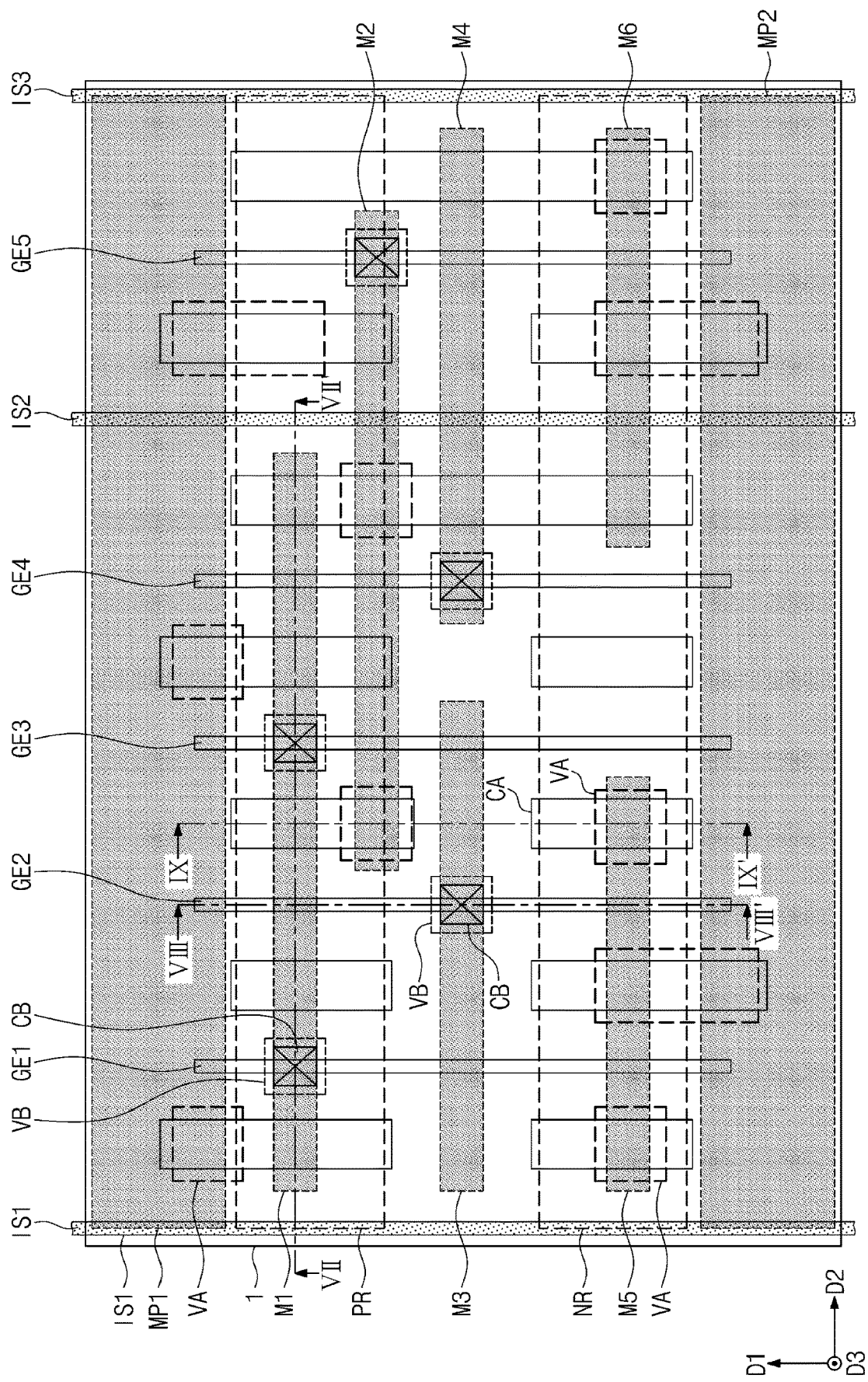
FIG. 22 illustrates a plan view showing a semiconductor device according to some embodiments of the present inventive concepts.

FIG. 22 illustrates a plan view showing a semiconductor device according to some embodiments of the present inventive concepts. FIGS. 23A, 23B, and 23C illustrate cross-sectional views taken along lines VII-VII', VIII-VIII', and IX-IX' of FIG. 22, respectively.

Referring to FIGS. 22, 23A, 23B, and 23C, a substrate 1 may include a PMOS or a PMOS transistor area PR and an NMOS or an NMOS transistor area NR. Although not shown in FIG. 22, likewise the illustration of FIG. 21A, the substrate 1 may include a main region MR and an edge region ER, and the PMOS and NMOS areas PR and NR may be disposed on the main region MR. The PMOS and NMOS areas PR and NR may be defined by a second trench TC2 formed on an upper portion of the substrate 1. The second trench TC2 may be positioned between the PMOS area and the NMOS area. The PMOS and NMOS areas PR and NR may be spaced apart from each other in a first direction D1 across the second trench TC2.

A plurality of active fins AF may be provided on each of the PMOS area PR and the NMOS area NR. The active fins AF may parallel extend in a second direction D2. The active fins AF may be vertically protruding portions of the substrate 1. A first trench TC1 may be defined between neighboring active fins AF. The first trench TC1 may be shallower than the second trench TC2.

A device isolation layer 33 may fill the first and second trenches TC1 and TC2. The device isolation layer 33 may include a silicon oxide layer. The active fins AF may have their upper portions that vertically protrude upwards from the device isolation layer 33. The device isolation layer 33 may not cover the upper portions of the active fins AF. The device isolation layer 33 may cover lower sidewalls of the active fins AF. First to fifth gate electrodes GE1 to GE5 may run across the active fins AF. Gate dielectric layers Gox may be interposed between the active fins AF and the first to fifth gate electrodes GE1 to GE5.

The active fins AF on the PMOS area PR may each include a first top surface TS1 and first lateral surfaces SW1. Each of the first to fifth gate electrodes GE1 to GE5 may cover the first top surfaces TS1 and the first lateral surfaces SW1. On the PMOS area PR, the active fins AF may correspondingly have first channel regions CH1 on their upper portions that correspondingly jump on the first to fifth gate dielectric layer GE1 to GE5. On the PMOS area PR, first source/drain patterns SD1 may be disposed on the active fins AF on opposite sidewalls of each of the first to fifth gate electrodes GE1 to GE5. The first source/drain patterns SD1 may include a semiconductor element (e.g., SiGe) whose lattice constant is greater than that of a semiconductor element of the substrate 1. Therefore, the first source/drain patterns SD1 may provide the first channel regions CH1 with compressive stress. The first source/drain patterns SD1 may be doped with p-type impurities (e.g., boron).

The active fins AF on the NMOS area NR may each include a second top surface TS2 and second lateral surfaces SW2. Each of the first to fifth gate electrodes GE1 to GE5 may cover the second top surfaces TS2 and the second lateral surfaces SW2. On the NMOS area NR, second channels CH2 may be correspondingly disposed on upper portions of the active fins AF that overlap each of the first to fifth gate electrodes GE1 to GE5. On the NMOS area NR, second source/drain patterns SD2 may be disposed on the active fins AF on opposite sides of each of the first to fifth gate electrodes GE1 to GE5. The second source/drain patterns SD2 may be semiconductor epitaxial patterns. For example, the second source/drain patterns SD2 may include the same semiconductor element (e.g., Si) as that of the substrate 1. The second source/drain patterns SD2 may be doped with n-type impurities (e.g., phosphorus or arsenic).

When viewed in plan viewed as shown in FIG. 22, a first power line MP1 may be disposed near the PMOS area PR, and a second power line MP2 may be disposed near the NMOS area NR. The first power line MP1 may be supplied with a first voltage. The second power line MP2 may be supplied with a second voltage different from the first voltage. One of the first and second voltages may be a power voltage (Vdd), and the other of the first and second voltages may be a ground voltage (Vss). First to sixth wiring lines M1 to M6 may be disposed between the first power line MP1 and the second power line MP2.

As shown in FIG. 23A, a first separation dielectric pattern IS1 and a second separation dielectric pattern IS2 may penetrate a first interlayer dielectric layer IL1 and the active fin AF, thereby extending into the substrate 1. The first separation dielectric pattern IS1 and the second separation dielectric pattern IS2 may include at least one selected from a silicon oxide layer, a silicon nitride layer, and a silicon oxynitride layer.

As show in FIG. 23B, a gate contact CB may penetrate the first interlayer dielectric layer IL1 and a gate capping pattern GP, thereby contacting the second gate electrode GE2. The gate contact CB may be disposed to overlap the device isolation layer 33 between the PMOS area PR and the NMOS area NR. The gate contact CB may be electrically connected through a gate via VB to the third wiring line M3.

As shown in FIG. 23C, the first source/drain patterns SD1 may contact each other. The second source/drain patterns SD2 may contact each other. The first source/drain patterns SD1 may be electrically connected to the second wiring line M2 through a source/drain contact CA and a source/drain via VA. The second source/drain patterns SD2 may be electrically connected to the fifth wiring line M5 through a source/drain contact CA and a source/drain via VA.

In FIGS. 22, 23A, 23B, and 23C, the active fins AF, the first to fifth gate electrodes GE1 to GE5, and the lines MP1, MP2, and M1 to M6 may be manufactured by using the semiconductor device fabricating method according to the present inventive concepts.

A semiconductor device fabricating method according to the present inventive concepts may use a spin-on-hardmask (SOH) layer as a sacrificial fill layer, which may result in the prevention of process failure. Etching processes may be in-situ performed to accomplish process simplification. Three kinds of pattern exposed to an opening may have different materials from each other, and thus the opening may be formed to have a relatively large width. Therefore, a process margin may increase. In addition, spaces between sacrificial spacers may be filled with a sacrificial fill layer or fill patterns to prevent the sacrificial spacers from deformation or collapse. Accordingly, it may be possible to prevent process failure and to increase a yield.

Further, a semiconductor device according to the present inventive concepts may be fabricated by the methods described above and may thus have improved reliability and high pattern density.

The foregoing disclosure has described semiconductor devices according to the present inventive concepts. The present inventive concepts can be embodied in other specific forms without departing from the technical spirit and scope of the present disclosure as defined by the appended claims. It therefore will be understood that the embodiments described above are just illustrative but not limitative in all aspects.

What is claimed is:

1. A method of fabricating a semiconductor device, the method comprising:
   stacking a lower mask layer on an entire surface of a substrate;
   forming on the lower mask layer a plurality of first upper mask patterns and a plurality of sacrificial spacers that cover sidewalls of the first upper mask patterns, wherein the first upper mask patterns and the sacrificial spacers have a line shape that extends in a first direction;
   forming a plurality of first holes that expose a top surface of an etching target layer by removing a portion of the first upper mask patterns and a portion of the lower mask layer below the first upper mask patterns;
   forming a plurality of second holes that expose the top surface of the etching target layer by removing a portion of the lower mask layer that is not covered by the first upper mask patterns and the sacrificial spacers;
   forming a plurality of second upper mask patterns and a plurality of sacrificial patterns, the second upper mask patterns filling a space between the sacrificial spacers on the lower mask layer, and the sacrificial patterns filling the first holes and the second holes;
   removing the sacrificial spacers to expose a top surface of the lower mask layer;

using the first and second upper mask patterns as an etching mask to etch the lower mask layer to form first and second lower mask patterns; and removing the sacrificial patterns.

2. The method of claim 1, wherein:

the first upper mask patterns include a first material, and the second upper mask patterns and the sacrificial patterns include a second material different from the first material.

3. The method of claim 1, wherein the forming of the first holes includes:

forming a sacrificial fill layer on the entire surface of the substrate on which the first upper mask patterns and the sacrificial spacers are formed, wherein the sacrificial fill layer covers the first upper mask patterns and the sacrificial spacers and simultaneously fills spaces between the sacrificial spacers;

etching a first portion of the sacrificial fill layer to form an opening that exposes top surfaces of the first upper mask patterns, top surfaces of the sacrificial spacers, and a top surface of a second portion of the sacrificial fill layer between the sacrificial spacers; and removing a portion of the first upper mask patterns exposed through the opening and a portion of the lower mask layer below the portion of the first upper mask patterns.

4. The method of claim 3, wherein the sacrificial fill layer is formed of a spin-on-hardmask (SOH) layer, and wherein, when viewed in plan, the opening is formed to have a bar or line shape that elongates in a second direction intersecting the first direction.

5. The method of claim 1, wherein the forming of the second holes includes:

forming a sacrificial fill layer on the entire surface of the substrate on which the first upper mask patterns and the sacrificial spacers are formed, wherein the sacrificial fill layer covers the first upper mask patterns and the sacrificial spacers and simultaneously fills spaces between the sacrificial spacers;

etching a first portion of the sacrificial fill layer to form an opening that exposes top surfaces of the first upper mask patterns, top surfaces of the sacrificial spacers, and a top surface of a second portion of the sacrificial fill layer between the sacrificial spacers; and removing the second portion of the sacrificial fill layer exposed through the opening and a portion of the lower mask layer below the second portion of the sacrificial fill layer.

6. The method of claim 5, wherein:

the sacrificial fill layer is formed of a spin-on-hardmask (SOH) layer, and when viewed in plan, the opening is formed to have a bar or line shape that elongates in a second direction intersecting the first direction.

7. The method of claim 1, wherein the forming of the second upper mask patterns and the sacrificial patterns includes:

forming a sacrificial fill layer on the entire surface of the substrate on which the first upper mask patterns, the sacrificial spacers, the first holes, and the second holes are formed; and blanket-etching the sacrificial fill layer to expose top surfaces of the first upper mask patterns and top surfaces of the sacrificial spacers.

8. The method of claim 1, further comprising:

before forming the lower mask layer, forming the etching target layer on the substrate; and after forming the first and second lower mask patterns, using the first and second lower mask patterns as an etching mask to etch the etching target layer.

9. The method of claim 1, further comprising:

using the first and second lower mask patterns as an etching mask to etch the substrate to form a plurality of fins that protrude from the substrate.

10. The method of claim 1, wherein the substrate includes a main region and an edge region, wherein the first upper mask patterns have the line shape on the main region, and a pair of neighboring ones among the first upper mask patterns are connected on the edge region, wherein the method further comprises forming a residual lower mask pattern on the edge region, and wherein the residual lower mask pattern has an arc or 'U' shape when viewed in plan.

11. The method of claim 1, wherein each of the first upper mask patterns and the sacrificial spacers has a first width in a second direction intersecting the first direction, and wherein the first width is in a range of about 5 nm to about 9 nm.

* * * * *